United States Patent
Jung et al.

(10) Patent No.: US 11,063,218 B2
(45) Date of Patent: Jul. 13, 2021

(54) METHOD OF FABRICATING SEMICONDUCTOR DEVICES USING A TWO-STEP GAP-FILL PROCESS

(71) Applicant: SAMSUNG ELECTRONICS CO., LTD., Suwon-si (KR)

(72) Inventors: Jaeho Jung, Seoul (KR); Youngmin Ko, Hwaseong-si (KR); Jonguk Kim, Yongin-si (KR); Kwangmin Park, Seoul (KR); Dongsung Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/746,258

(22) Filed: Jan. 17, 2020

(65) Prior Publication Data

US 2021/0050522 A1 Feb. 18, 2021

(30) Foreign Application Priority Data

Aug. 12, 2019 (KR) ........................ 10-2019-0098185

(51) Int. Cl.
*H01L 21/00* (2006.01)
*H01L 45/00* (2006.01)
*H01L 27/24* (2006.01)

(52) U.S. Cl.
CPC ...... *H01L 45/1683* (2013.01); *H01L 27/2427* (2013.01); *H01L 27/2463* (2013.01); *H01L 45/06* (2013.01); *H01L 45/1233* (2013.01); *H01L 45/1253* (2013.01); *H01L 45/144* (2013.01)

(58) Field of Classification Search
CPC .. H01L 21/00; H01L 45/1683; H01L 27/2463
See application file for complete search history.

(56) References Cited

U.S. PATENT DOCUMENTS

| | | | |
|---|---|---|---|
| 7,790,634 B2 | 9/2010 | Munro et al. | |
| 8,703,624 B2 | 4/2014 | Yang et al. | |
| 8,926,745 B2 | 1/2015 | Chu et al. | |
| 9,362,107 B2 | 6/2016 | Thadani et al. | |
| 9,412,581 B2 | 8/2016 | Thadani et al. | |
| 2015/0214015 A1 | 7/2015 | Kikuchi et al. | |

(Continued)

FOREIGN PATENT DOCUMENTS

KR 10-0884632 B1 2/2009

*Primary Examiner* — Caleb E Henry
(74) *Attorney, Agent, or Firm* — Lee IP Law, PC

(57) ABSTRACT

A method of fabricating a memory device includes forming word lines and cell stacks with gaps between the cell stacks, forming a lower gap-fill insulator in the gaps, forming an upper gap-fill insulator on the lower gap-fill insulator, curing the lower gap-fill insulator and the upper gap-fill insulator to form a gap-fill insulator, and forming bit lines on the cell stacks and the gap-fill insulator. The lower gap-fill process may be performed using a first source gas that includes first and second precursors, and the upper gap-fill process may be performed using a second source gas that includes the first and second precursors, a volume ratio of the first precursor to the second precursor in the first source gas may be greater than 15:1, and a volume ratio of the first precursor to the second precursor in the second source gas may be less than 15:1.

20 Claims, 26 Drawing Sheets

(56) References Cited

U.S. PATENT DOCUMENTS

| | | | |
|---|---|---|---|
| 2015/0243708 A1* | 8/2015 | Ravasio | H01L 45/1675 |
| | | | 257/4 |
| 2015/0372061 A1* | 12/2015 | Lee | H01L 45/04 |
| | | | 438/382 |
| 2016/0133671 A1* | 5/2016 | Fantini | H01L 27/2427 |
| | | | 257/4 |
| 2018/0286669 A1 | 10/2018 | Mallick et al. | |
| 2018/0315598 A1 | 11/2018 | Li et al. | |
| 2018/0347035 A1 | 12/2018 | Weimer et al. | |
| 2018/0358556 A1 | 12/2018 | Kang et al. | |
| 2018/0375023 A1* | 12/2018 | Song | H01L 45/06 |
| 2019/0040205 A1 | 2/2019 | Knott et al. | |

\* cited by examiner

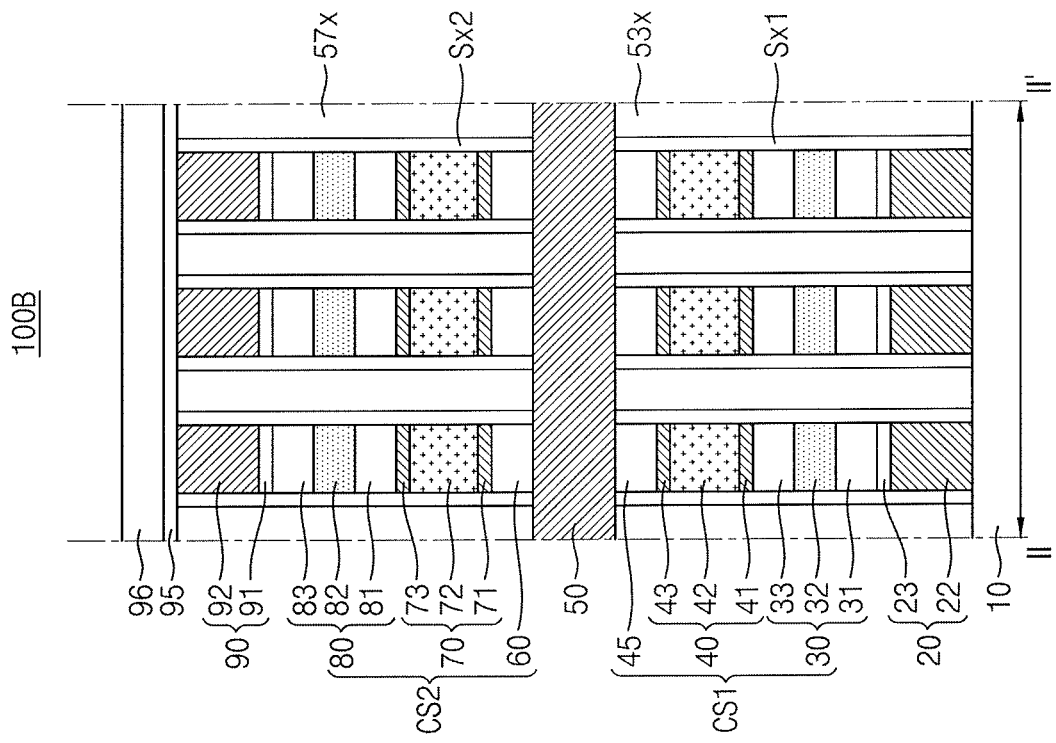
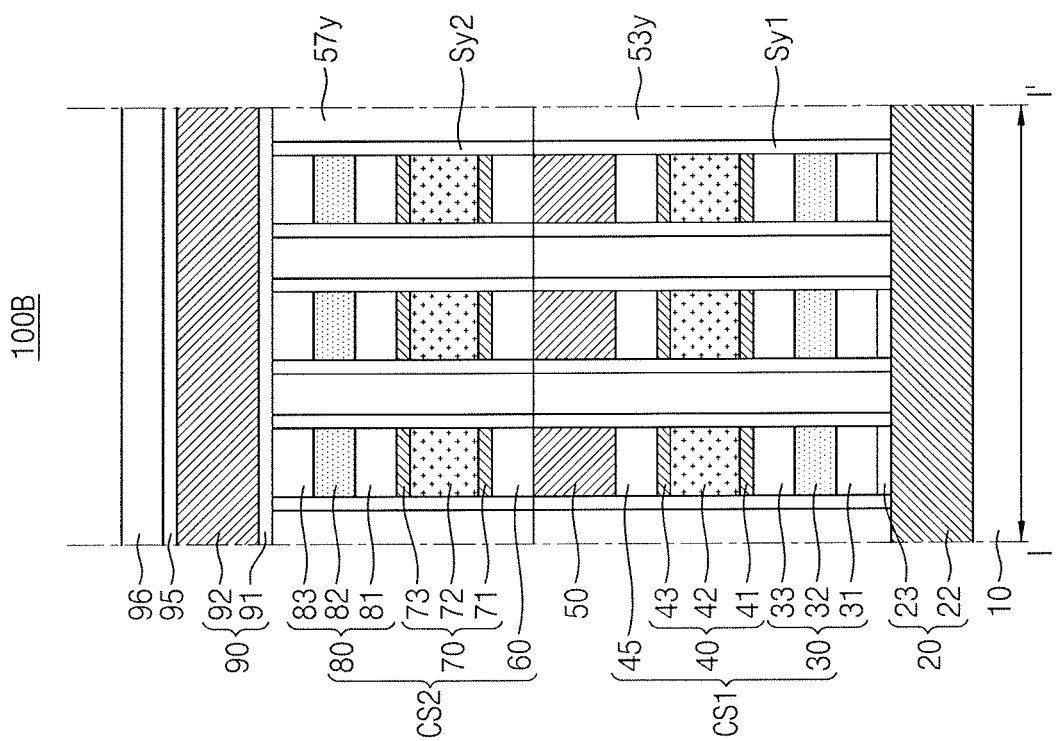

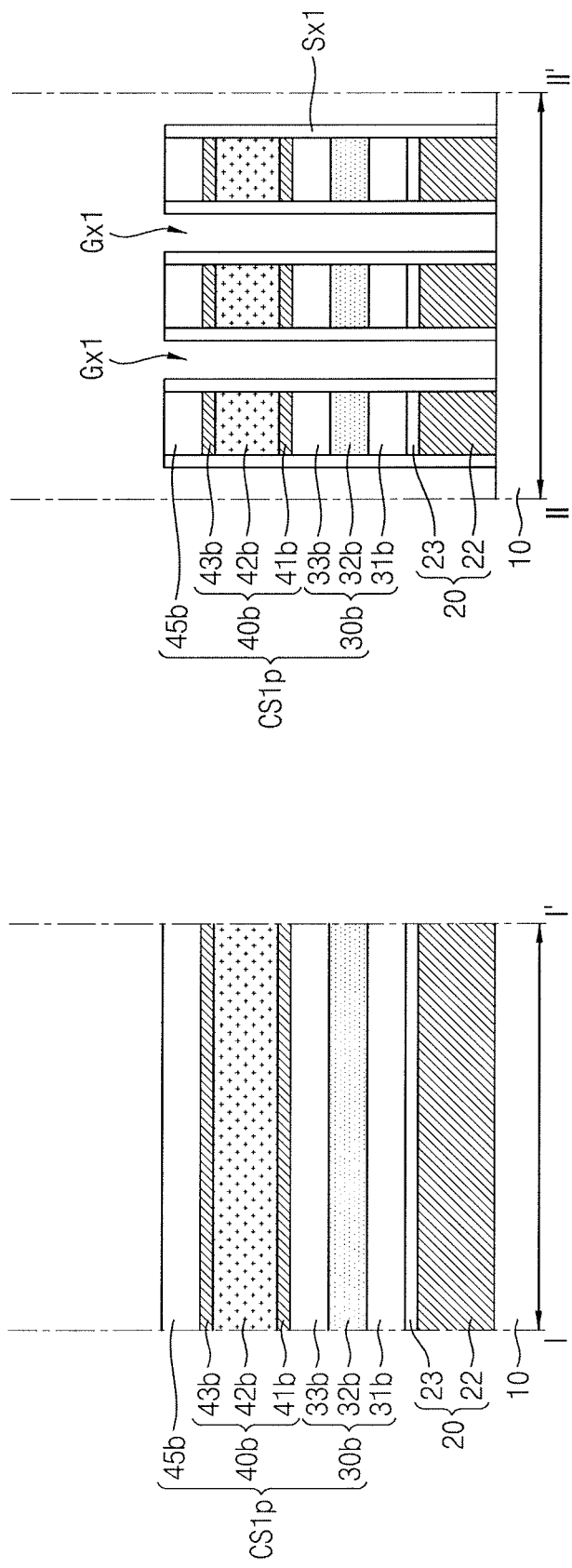

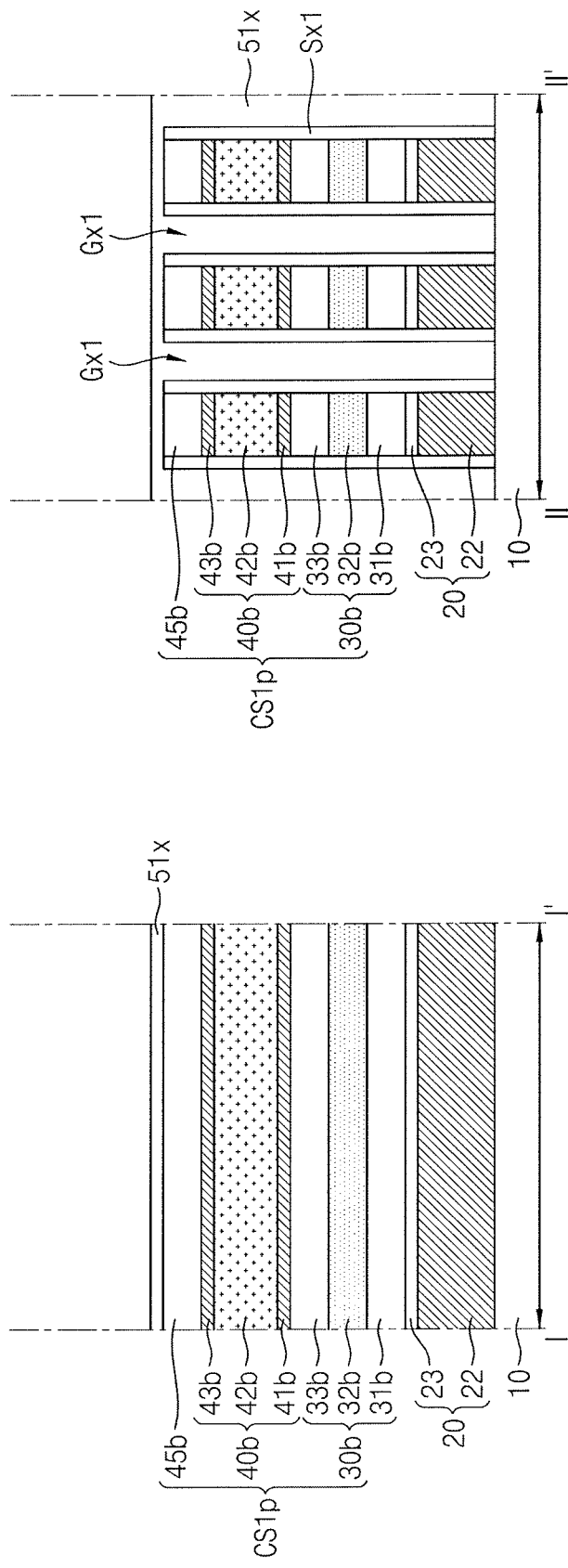

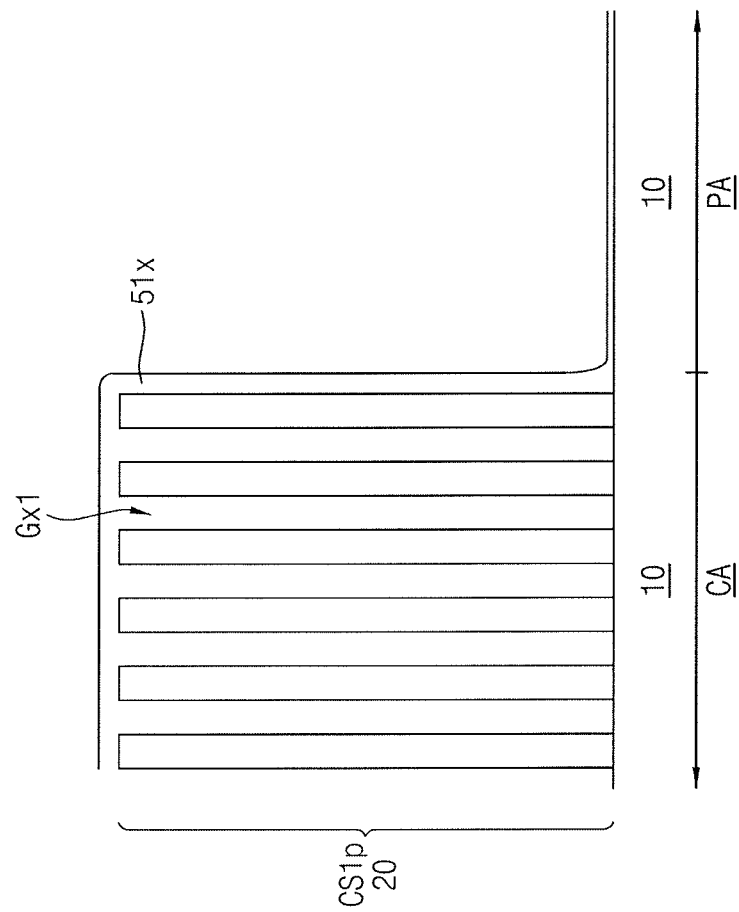

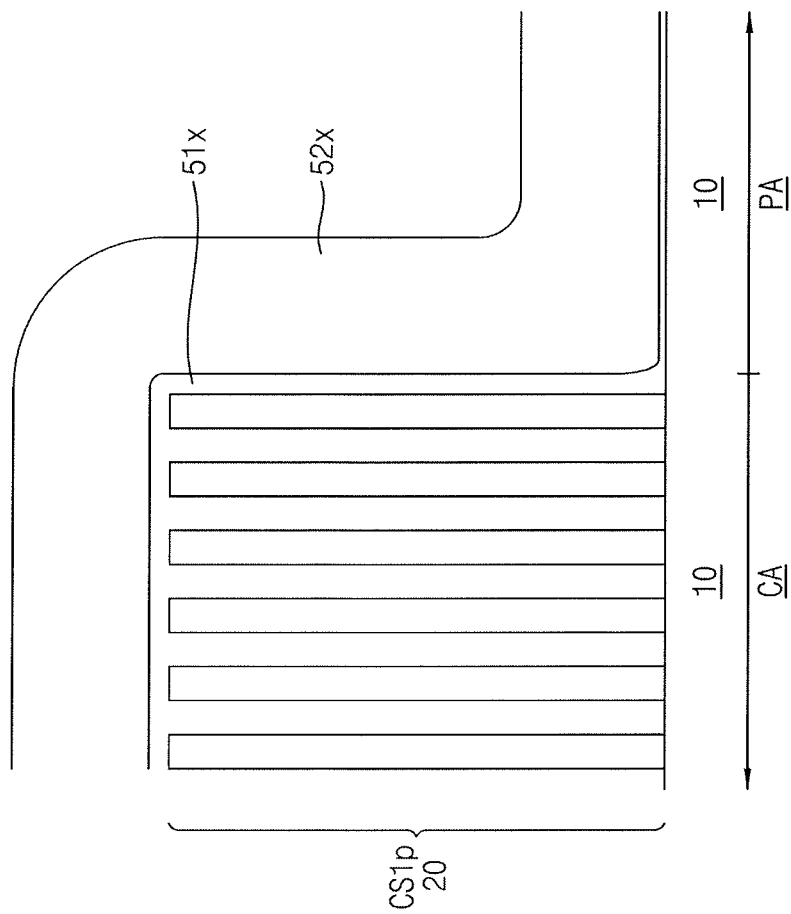

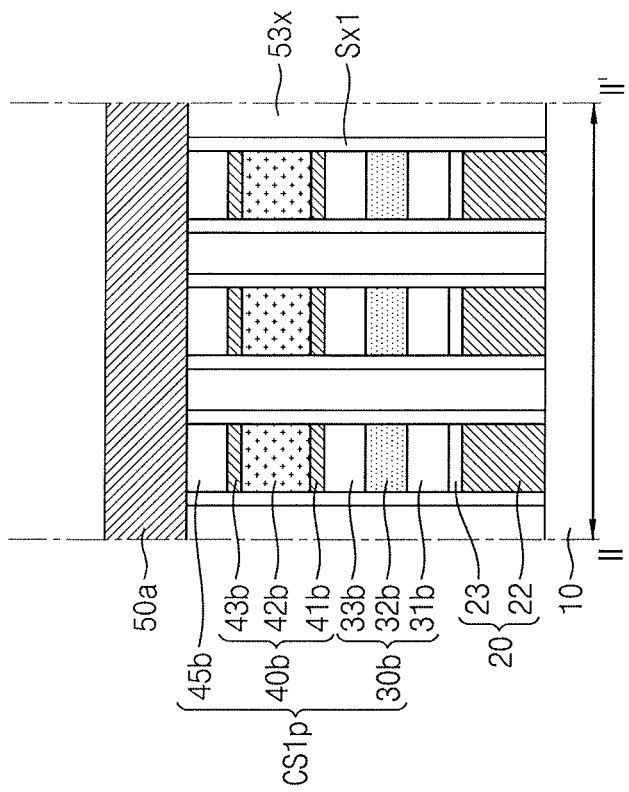
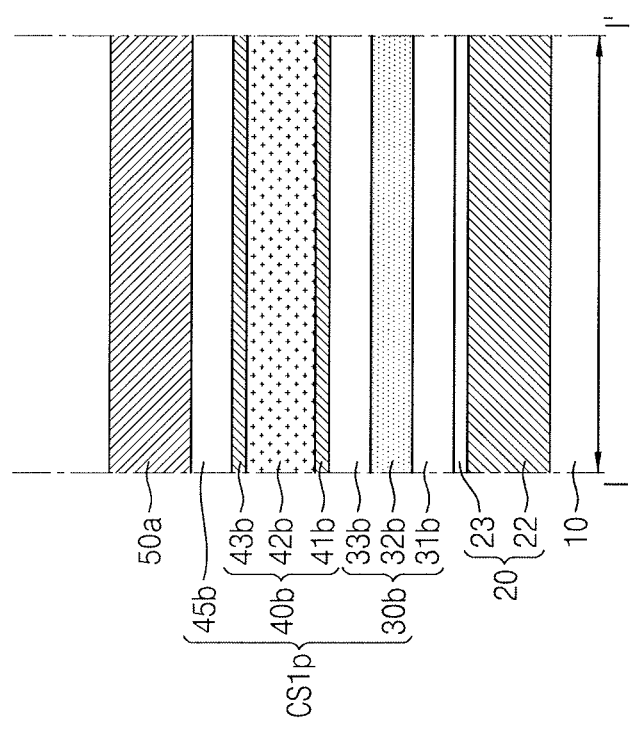
FIG. 10A
FIG. 10B

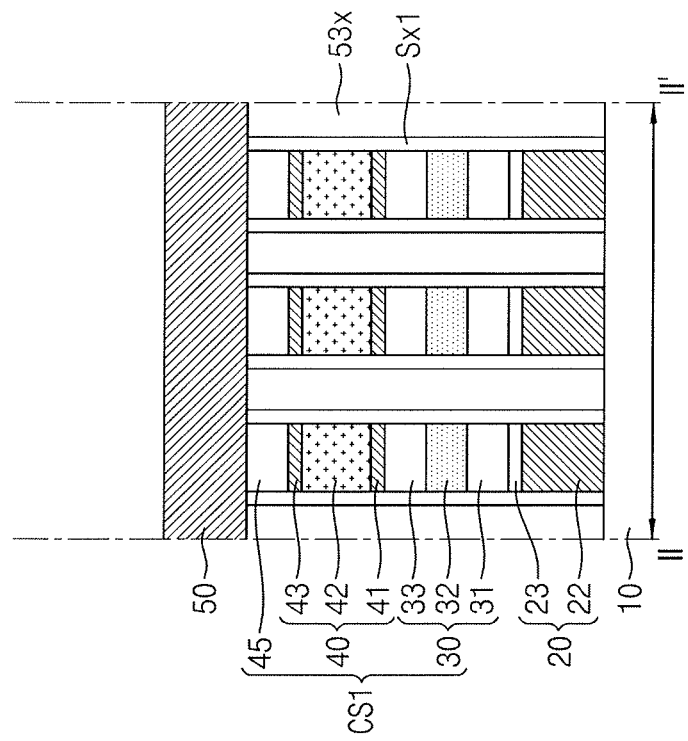
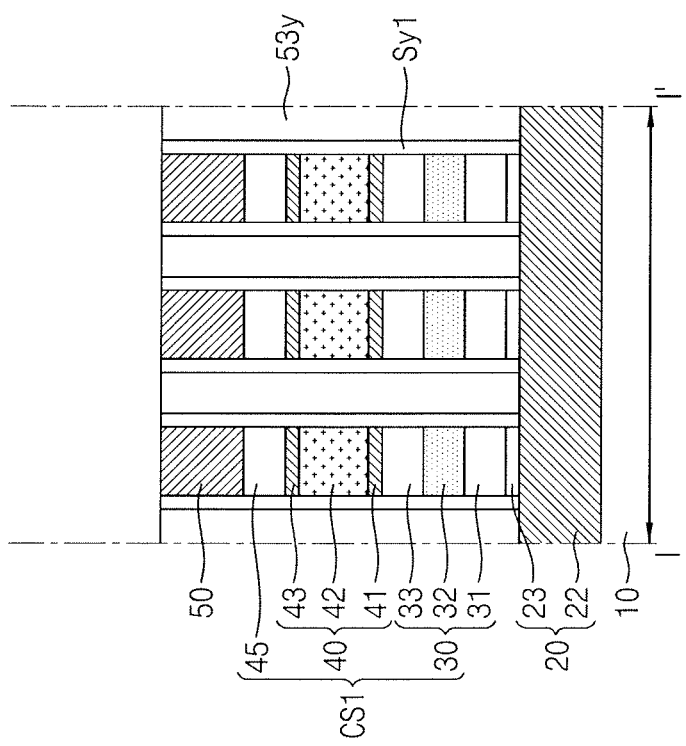

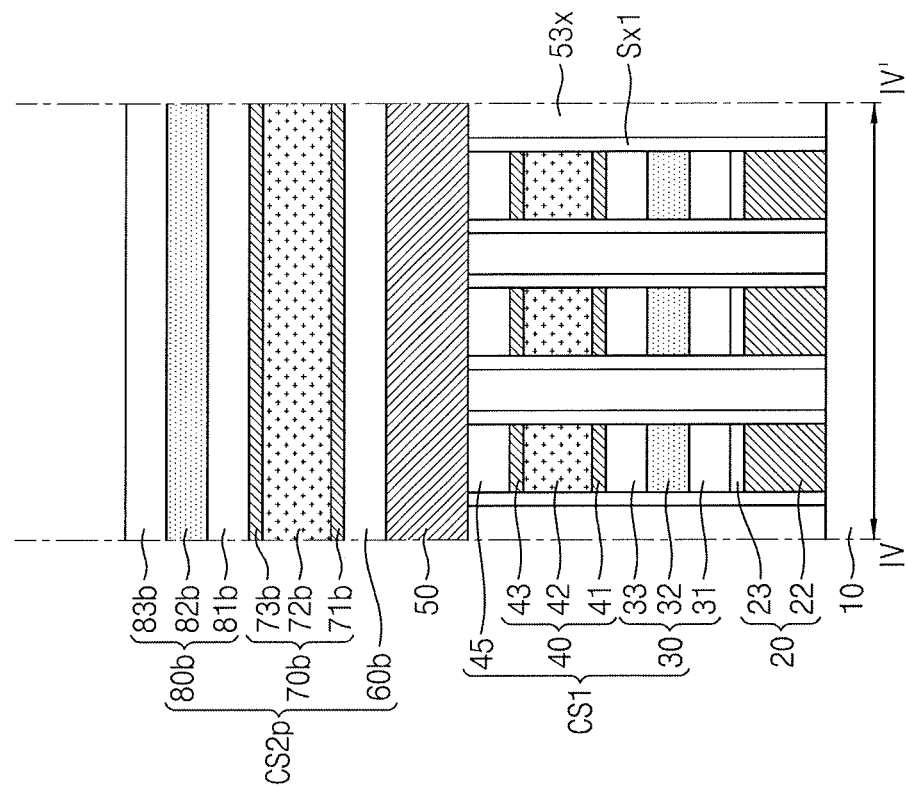
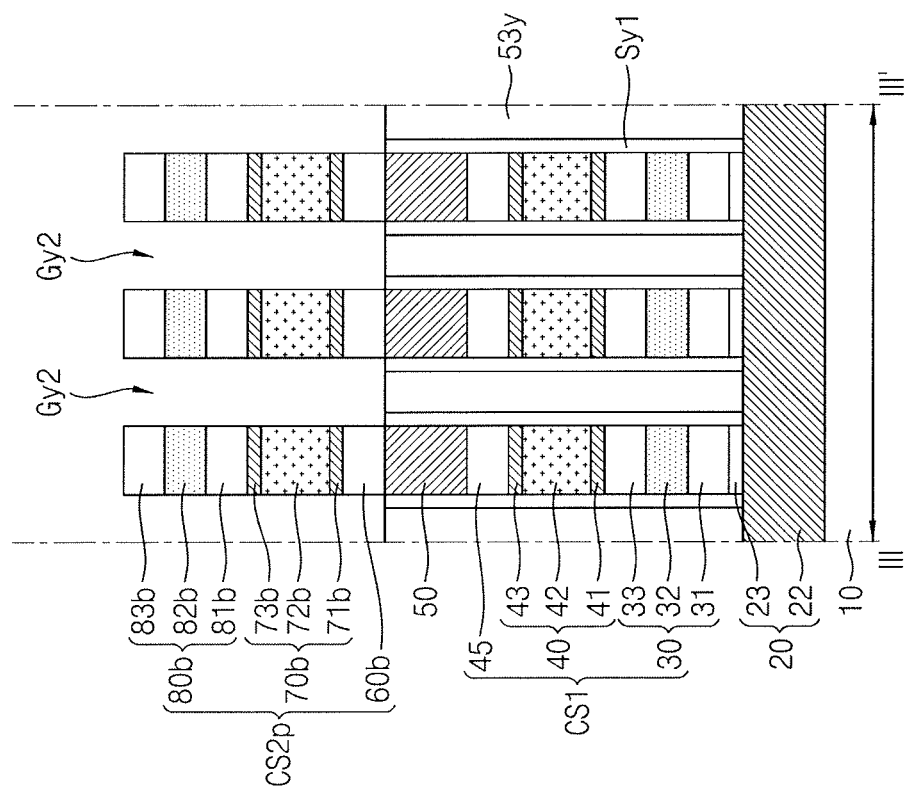

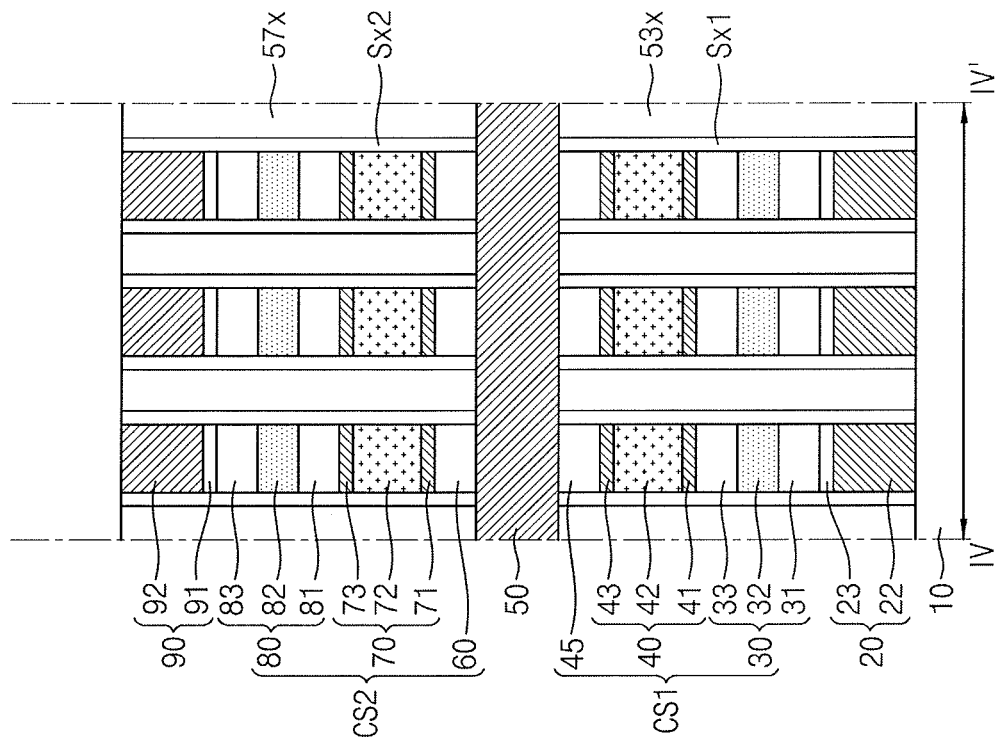
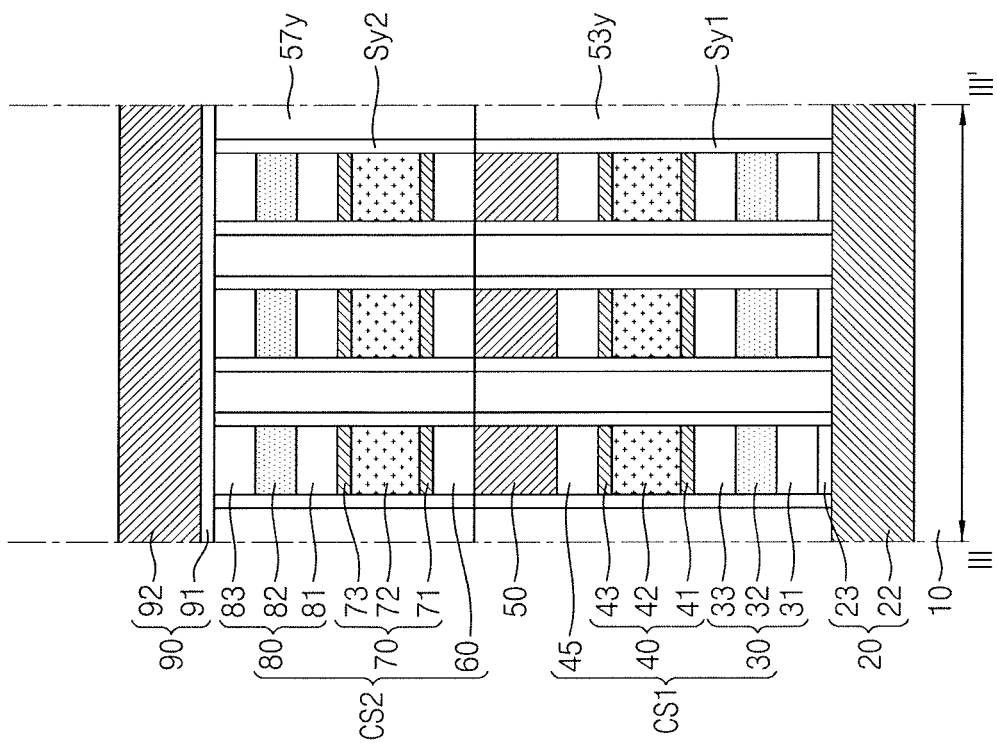

METHOD OF FABRICATING SEMICONDUCTOR DEVICES USING A TWO-STEP GAP-FILL PROCESS

CROSS-REFERENCE TO RELATED APPLICATION

Korean Patent Application No. 10-2019-0098185, filed on Aug. 12, 2019, in the Korean Intellectual Property Office, and entitled: "Method of Fabricating Semiconductor Devices Using a Two-Step Gap-Fill Process," is incorporated by reference herein in its entirety.

BACKGROUND

1. Field

Embodiments relate to a cross-point type semiconductor memory device and methods of forming the cross-point type semiconductor memory device using a two-step gap-fill process.

2. Description of the Related Art

As the degree of integration of semiconductor memory devices increases and patterns become smaller, the aspect ratio of a memory cell stack becomes very large.

SUMMARY

Embodiments are directed to a method of fabricating a cross-point type semiconductor memory device, the method including forming a first word line material layer and a first cell stack material layer on an underlayer, patterning the first cell stack material layer and the first word line material layer to form first preliminary cell stacks, first word lines, and first X-directional gaps using a first X-directional trimming process, wherein the first preliminary cell stacks and the first word lines extend in an X-direction, and the first X-directional gaps extend in the X-direction between the first preliminary cell stacks, forming a first lower X-directional gap-fill insulator that fills the first X-directional gaps using a first lower X-directional gap-fill process, forming a first upper X-directional gap-fill insulator on the first lower X-directional gap-fill insulator using a first upper X-directional gap-fill process, and forming a first X-directional gap-fill insulator using a curing process and a planarization process on the first lower X-directional gap-fill insulator and the first upper X-directional gap-fill insulator. The first lower X-directional gap-fill process may be performed using a first source gas that includes a first precursor and a second precursor, and the first upper X-directional gap-fill process may be performed using a second source gas that includes the first precursor and the second precursor, a first volume ratio of the first precursor to the second precursor in the first source gas may be greater than 15:1, and a second volume ratio of the first precursor to the second precursor in the second source gas may be less than 15:1.

Embodiments are also directed to a method of fabricating a cross-point type semiconductor memory device, the method including forming word lines and cell stacks on an underlayer, gaps being formed between the cell stacks, performing a lower gap-fill process to form a lower gap-fill insulator in the gaps, performing an upper gap-fill process to form an upper gap-fill insulator on the lower gap-fill insulator, curing the lower gap-fill insulator and the upper gap-fill insulator to form a gap-fill insulator, and forming bit lines on the cell stacks and the gap-fill insulator. The lower gap-fill process may be performed using a first source gas that includes a first precursor and a second precursor, and the upper gap-fill process may be performed using a second source gas that includes the first precursor and the second precursor, the first precursor may include octamethylcyclotetrasiloxane, the second precursor may include at least one of tetramethoxysilane or tetramethylorthosilicate, a first volume ratio of the first precursor to the second precursor in the first source gas may be greater than 15:1, and a second volume ratio of the first precursor to the second precursor in the second source gas may be less than 15:1.

Embodiments are also directed to a method of fabricating a cross-point type semiconductor memory device, the method including forming a word line material layer and a cell stack material layer on an underlayer, performing an X-directional trimming process to form preliminary cell stacks and word lines, wherein the preliminary cell stacks and word lines extend in an X-direction, and X-directional gaps extending in the X-direction are formed between the preliminary cell stacks, forming X-directional spacers on opposite sidewalls of the word lines and the preliminary cell stacks in the X-directional gaps, performing a lower X-directional gap-fill process to form a lower X-directional gap-fill insulator that fills the X-directional gaps between the X-directional spacers, performing an upper X-directional gap-fill process to form an upper X-directional gap-fill insulator on the lower X-directional gap-fill insulator, curing and planarizing the lower X-directional gap-fill insulator and the upper X-directional gap-fill insulator to form an X-directional gap-fill insulator, performing a Y-directional trimming process to form cell stacks, wherein the cell stacks have a columnar shape, and Y-directional gaps extending in a Y-direction are formed between the cell stacks, forming Y-directional spacers on opposite sidewalls of the cell stacks and the X-directional gap-fill insulator in the Y-directional gaps, performing a lower Y-directional gap-fill process to form a lower Y-directional gap-fill insulator that fills the Y-directional gaps between the Y-directional spacers, performing an upper Y-directional gap-fill process to form an upper Y-directional gap-fill insulator on the lower Y-directional gap-fill insulator, and curing and planarizing the lower Y-directional gap-fill insulator and the upper Y-directional gap-fill insulator to form a Y-directional gap-fill insulator. The lower X-directional gap-fill process and the lower Y-directional gap-fill process may be performed using a first source gas that includes a first precursor and a second precursor, and the upper X-directional gap-fill process and the upper Y-directional gap-fill process may be performed using a second source gas that includes the first precursor and the second precursor, a first volume ratio of the first precursor to the second precursor in the first source gas may be greater than 15:1, and a second volume ratio of the first precursor to the second precursor in the second source gas may be less than 15:1.

BRIEF DESCRIPTION OF THE DRAWINGS

Features will become apparent to those of skill in the art by describing in detail example embodiments with reference to the attached drawings in which:

FIGS. 3A and 3B illustrate vertical longitudinal cross-sectional views of a cross-point type semiconductor memory device taken along the line III-III'and IV-IV' shown in FIG. 1B, respectively.

FIGS. 4A and 4B to 24A and 24B illustrate stages in methods of forming the cross-point type semiconductor memory devices shown in FIGS. 1A to and 3B.

DETAILED DESCRIPTION

Figures 1A, 1B:
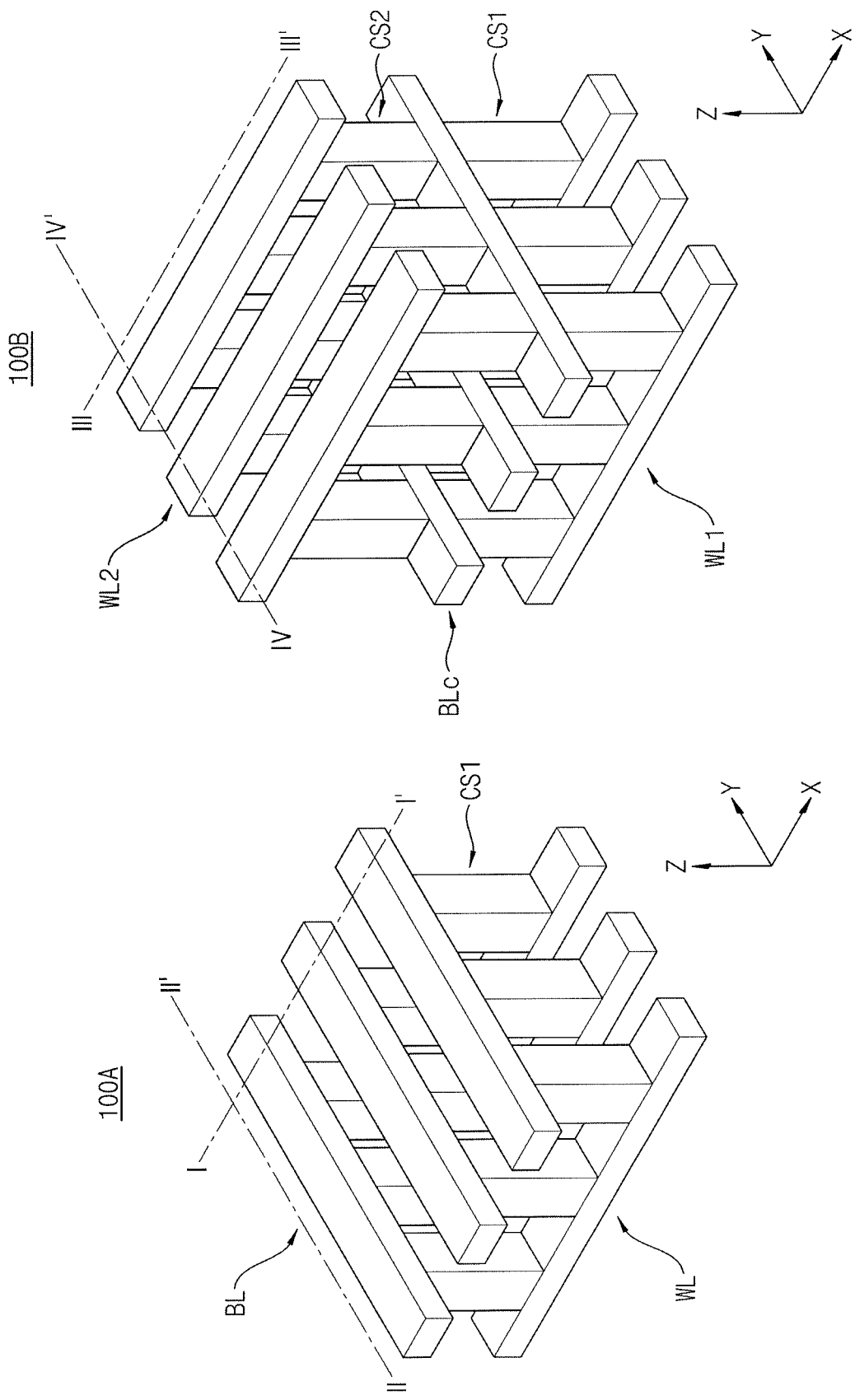
FIGS. 1A and 1B illustrate schematic three-dimensional perspective views of cross-point type semiconductor memory devices in accordance with example embodiments.

FIGS. 1A and 1B are schematic three-dimensional perspective views of cross-point type semiconductor memory devices 100A and 100B in accordance with example embodiments.

Referring to FIG. 1A, the cross-point type semiconductor memory device 100A in accordance with an example embodiment may include word lines WL extending horizontally and parallel in an X-direction, bit lines BL extending horizontally and parallel in a Y-direction, and cell stacks CS1 disposed at intersections between the word lines WL and the bit lines BL in a Z-direction. The X-direction, Y-direction, and Z-direction may be perpendicular to one another.

The word lines WL and the bit lines BL may include a conductor capable of transmitting an electrical signal, respectively. The word lines WL may provide a voltage or current to the cell stacks CS1, and the bit lines BL may transfer the voltage or current provided from the word lines WL to pass through the cell stacks CS1 to outer circuitry.

Each of the cell stacks CS1 may include memory cells that vary according to voltages or currents provided from the word lines WL. For example, the cell stacks CS1 may include a phase-changeable memory cell, a resistance-changeable memory cell, a magnetism-changeable memory cell, a conductive bridge memory cell, or various other memory cells.

Referring to FIG. 1B, a cross-point type semiconductor memory device 100B in accordance with an example embodiment may include lower word lines WL1 extending horizontally and parallel in the X-direction, common bit lines BLc extending horizontally and parallel in the Y-direction, upper word lines WL2 extending horizontally and parallel in the X-direction, lower cell stacks CS1 disposed at intersections between the lower word lines WL1 and the common bit lines BLc in the Z-direction, and upper cell stacks CS2 disposed at intersections between the common bit lines BLc and the upper word lines WL2.

The lower word lines WL1, the lower cell stacks CS1, and the common bit lines BLc may form a lower memory structure, and the upper word lines WL2, the upper cell stacks CS2, and the common bit lines BLc may form an upper memory structure. For example, the lower memory structure and the upper memory structure may have a symmetrical structure sharing the common bit lines BLc.

Figure 2A:
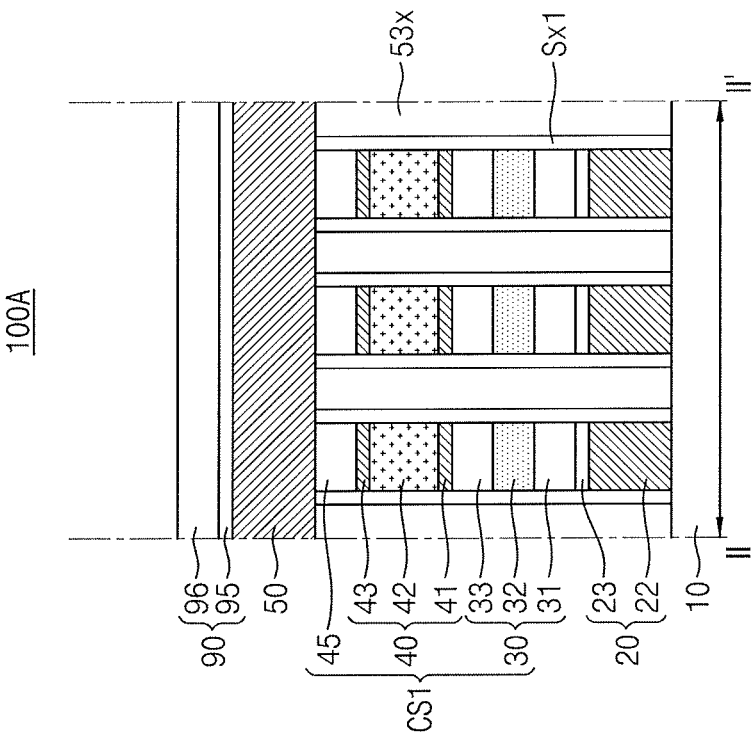
FIGS. 2A and 2B illustrate longitudinal cross-sectional views of a cross-point type semiconductor memory device taken along the line I-I' and II-II' shown in FIG. 1A, respectively.
Figure 2B:
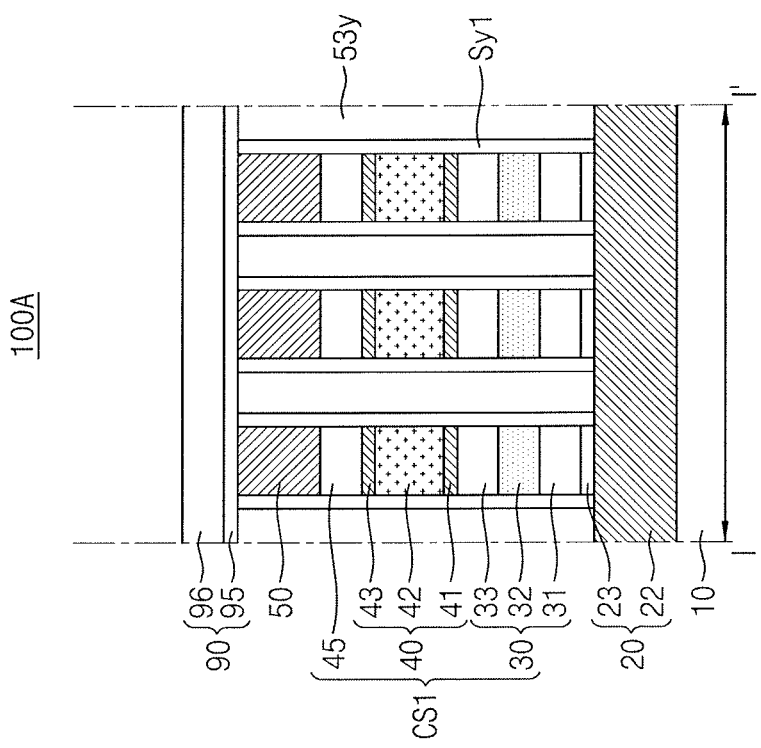

FIGS. 2A and 2B are longitudinal cross-sectional views of the cross-point type semiconductor memory device 100A taken along the lines I-I' and II-II' shown in FIG. 1A, respectively.

Referring to FIGS. 2A and 2B, the cross-point type semiconductor memory device 100A may include word lines 20, the cell stacks CS1, and bit lines 50 stacked on an underlayer 10.

The underlayer 10 may include a substrate or an insulator such as silicon dioxide ($SiO_2$) or silicon nitride (SiN).

Each of the word lines 20 may include a word line electrode 22 and a word line barrier 23. The word line electrode 22 may extend in a first horizontal direction, i.e., the X-direction. The word line electrode 22 may include, for example, a metal such as tungsten (W), and the word line barrier 23 may include, for example, a barrier metal such as titanium nitride (TiN). In an example embodiment, the word line barrier 23 may be interposed between the cell stack CS1 and the word line electrode 22 as an island shape. In an example embodiment, the word line barrier 23 may extend along the word line electrode 22 in the first horizontal direction as a line shape. For example, the word line barrier 23 may be conformally formed on the word line electrode 22. In an example embodiment, an additional barrier including the same material as the word line barrier 23 may be further formed between the underlayer 10 and the word line electrode 22.

The cell stacks CS1 may have a square pillar shape. Each of the cell stacks CS1 may include a switching element 30, a memory element 40, and an upper electrode 45.

The switching element 30 may include a lower electrode 31, a switching electrode 32, and an intermediate electrode 33. The lower electrode 31 and the intermediate electrode 33 may include a metal, or a non-metal conductor such as an N-doped carbon. The switching electrode 32 may include an ovonic threshold switch (OTS) material. For example, the OTS material may include at least one of chalcogenide materials such as selenium (Se), arsenic (As), germanium (Ge), silicon (Si), or indium (In).

Each of the memory elements 40 may include a lower interface 41, a memory cell 42, and an upper interface 43. The lower interface 41 and the upper interface 43 may include conductors capable of adjusting a threshold voltage or a work function. For example, the lower interface 41 and the upper interface 43 may include a metal such as tungsten (W), aluminum (Al), titanium (Ti), a metal alloy, or a metal compound. The memory cell 42 may include a resistance changeable material, a phase changeable material, a magneto-resistance changeable material, a conductive bridge material, or various other variable resistance materials. In an example embodiment, memory cell 42 may include a phase changeable material such as GeSbTe (GST).

The upper electrode 45 may include a metal, or a non-metal conductor such as an N-doped carbon. For example, the upper electrode 45 may include the same material as the lower electrode 31 or the intermediate electrode 33.

The bit lines 50 may extend in parallel in a second horizontal direction, i.e., the Y-direction. The first horizontal direction and the second horizontal direction may be perpendicular to each other. The bit lines 50 may include a metal such as tungsten (W). In an example embodiment, an additional barrier material layer may be further formed between the upper electrode 45 and the bit line 50.

X-directional spacers Sx1 and Y-directional spacers Sy1 may be conformally formed on sidewalls of the word lines 20, the cell stacks CS1, and the bit lines 50, respectively. Referring to FIG. 2A, in the longitudinal cross-sectional view taken along the line I-I' of FIG. 1, the Y-directional spacers Sy1 may be formed on both or opposite sidewalls of the cell stacks CS1 and the bit lines 50. Referring to FIG. 2B, in the longitudinal cross-sectional view taken along the line II-II' of FIG. 1, the X-directional spacers Sx1 may be conformally formed on both or opposite sidewalls of the word lines 20 and the cell stacks CS1. The X-directional spacers Sx1 and the Y-directional spacers Sy1 may include an insulator such as silicon nitride (SiN).

X-directional gap-fill insulators 53x and Y-directional gap-fill insulators 53y may be formed between word lines 20, cell stacks CS1, and/or bit lines 50, e.g., between the X-directional spacers Sx1 and/or the Y-directional spacers Sy1. Referring to FIG. 2A, in the longitudinal cross-sectional view taken along the line I-I' of FIG. 1, the Y-directional gap-fill insulator 53y may be formed between the Y-directional spacers Sy1 on both or opposite sidewalls of the cell stacks CS1 and the bit lines 50. Referring to FIG. 2B, in the longitudinal cross-sectional view taken along the line II-II' of FIG. 1, the X-directional gap-fill insulator 53x may be formed between the X-directional spacers Sx1 on both or opposite sidewalls of the word lines 20 and the cell stacks CS1. The X-directional gap-fill insulator 53x and the Y-directional gap fill insulator 53y may include an insulator such as silicon dioxide ($SiO_2$), silicon oxy-carbide (SiOC), or silicon oxy-hydro-carbide (SiOHC). In an example embodiment, the X-directional gap-fill insulator 53x and the Y-directional gap fill insulator 53y may include silicon oxy-carbide (SiOC).

Upper surfaces of the upper electrodes 45 of the cell stacks CS1, the X-directional spacers Sx1, and the X-directional gap-fill insulator 53x may be coplanar. Upper surfaces of the bit lines 50, the Y-directional spacers Sy1, and the Y-directional gap-fill insulator 53y may be also coplanar.

The cross-point type semiconductor memory device 100A may further include a capping liner 95 and a capping insulator 96 on the bit lines 50. The capping liner 95 may include a barrier metal layer or an oxidizing-resistant insulator. In an example embodiment, the capping liner 95 may include a conductive barrier metal such as titanium nitride (TiN). In an example embodiment, the capping liner 95 may include an insulator such as silicon nitride (SiN). In an example embodiment, the capping liner 95 may be a bi-layer having a bottom layer including a conductive barrier metal and a top layer including an insulator. In an example embodiment, the capping liner 95 may be only formed on the bit lines 50. The capping insulator 96 may include an insulator such as silicon dioxide ($SiO_2$).

FIGS. 3A and 3B are vertical longitudinal cross-sectional views of the cross-point type semiconductor memory device 100B taken along the line III-III' and IV-IV' shown in FIG. 1B, respectively.

Referring to FIGS. 3A and 3B, the cross-point type semiconductor memory device 100B in accordance with an example embodiment may include first word lines 20, first cell stacks CS1, common bit lines 50, second cell stacks CS2, and second word lines 90 stacked on an underlayer 10.

Each of the first word lines 20 may include a first word line electrode 22 and a first word line barrier 23.

Each of the first cell stacks CS1 may include a first switching element 30, a first memory element 40, and a first upper electrode 45.

The first switching element 30 may include a first lower electrode 31, a first switching electrode 32, and a first intermediate electrode 33.

The first memory element 40 may include a first lower interface 41, a first memory cell 42, and a first upper interface 43.

First X-directional spacers Sx1 and first Y-directional spacers Sy1 may be conformally formed on both or opposite sidewalls of the first word lines 20, the first cell stacks CS1, and the common bit lines 50.

First X-directional gap-fill insulators 53x and first Y-directional gap-fill insulator 53y may be formed between the first word lines 20, the first cell stacks CS1, and/or the common bit lines 50, e.g., between the first X-directional spacers Sx1 and the first Y-directional spacers Sy1.

The underlayer 10, the first word lines 20, the first cell stacks CS1, the common bit lines 50, the first X-directional spacers Sx1, the first Y-directional spacers Sy1, the first X-directional gap-fill insulators 53x, and the first Y-directional gap-fill insulators 53y may be understood with reference to FIGS. 2A and 2B.

Each of the second cell stacks CS2 may include a second lower electrode 60, a second memory element 70, and a second switching element 80.

The second lower electrode 60 may include a metal, or a non-metal conductor such as an N-doped carbon. The first upper electrode 45 and the second lower electrode 60 may include the same material.

The second memory element 70 may include a second lower interface 71, a second memory cell 72, and a second upper interface 73.

The second lower interface 71 may include the same material as the first upper interface 43, and the second upper interface 73 may include the same material as the first lower interface 41. In an example embodiment, the second lower interface 71 and the second upper interface 73 may include the same material. The second memory cell 72 may include the same material as the first memory cell 42.

The second switching element 80 may include a second intermediate electrode 81, a second switching electrode 82, and a second upper electrode 83. The second intermediate electrode 81 may include the same material as the first intermediate electrode 33. The second upper electrode 83 may include the same material as the first lower electrode 31. The second switching electrode 82 may include the same material as the first switching electrode 32.

Each of the second word lines 90 may include a second word line barrier 91 and a second word line electrode 92. The second word line barrier 91 and the second word line electrode 92 may extend in the first horizontal direction, i.e., the X-direction. The second word line barrier 91 may include the same material as the first word line barrier 23. The second word line electrode 92 may include the same material as the first word line electrode 22.

Second X-directional spacers Sx2 and second Y-directional spacers Sy2 may be conformally formed on sidewalls of the second cell stacks CS2 and/or the second word lines 90. Referring to FIG. 3A, the second Y-directional spacers Sy2 may be conformally formed on both or opposite sidewalls of the second cell stacks CS2. Referring to FIG. 3B, the second X-directional spacers Sx2 may be conformally formed on both or opposite sidewalls of the second cell stacks CS2 and the second word lines 90. The second X-directional spacers Sx2 and the second Y-directional spacers Sy2 may include the same material as the first X-directional spacers Sx1 and the first Y-directional spacers Sy1. Second X-directional gap-fill insulators 57x and second Y-directional gap-fill insulators 57y may be formed between the second cell stack CS2 and the second word line 90, e.g., between the second X-directional spacers Sx2 and the second Y-directional spacers Sy2. The second X-directional gap-fill insulators 57x and the second Y-directional gap-fill insulators 57y may include the same material as the first X-directional gap-fill insulators 53x and the first Y-directional gap-fill insulators 53y.

The second word line barrier 91 may be disposed between the second word line electrode 92 and the second upper electrode 83, and between the second word line electrode 92 and the second X-directional spacer Sx2 and between the second word line electrode 92 and the second X-directional gap-fill insulator 57x to extend in the horizontal direction.

The first cell stack CS1 and the second cell stack CS2 shown in FIGS. 3A and 3B may have a vertically symmetrical structure. For example, the first cell stack CS1 may have a stack structure that is a mirror of the second cell stack CS2. The first cell stack CS1 may receive an electrical signal from the first word line 20 and provide data information of the first memory cell 42 to the common bit line 50, and the second cell stack CS2 may receive an electrical signal from the second word line 90 and provide data information of the second memory cell 72 to the common bit line 50. The first memory cell 42 may store information of an electrical signal received from the first word line 20, and the second memory cell 72 may store information of an electrical signal received from the second word line 90.

The cross-point type semiconductor memory device 100B may further include a capping liner 95 and a capping insulator 96 on the second word line 90.

FIGS. 4A and 4B to 14A and 14B are diagrams for describing a method of forming the cross-point type semiconductor memory device 100A shown in FIGS. 1A, 2A, and 2B.

Figure 4A:
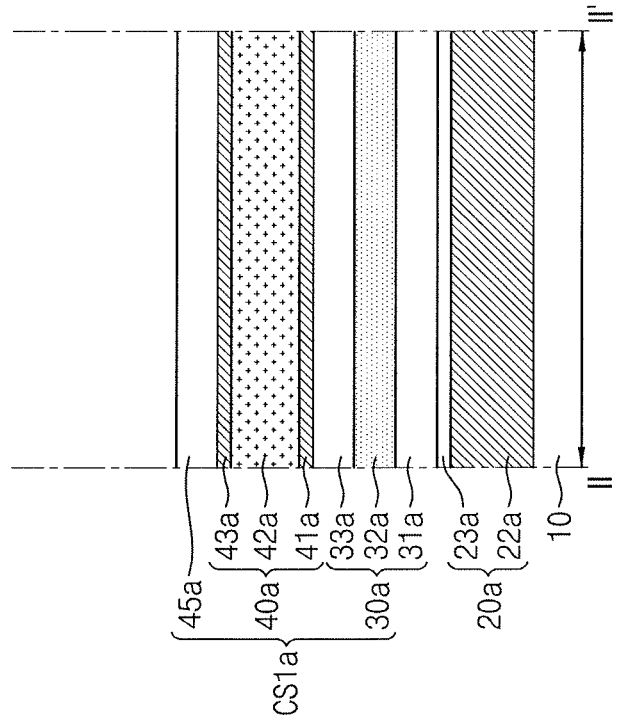
Figure 4B:
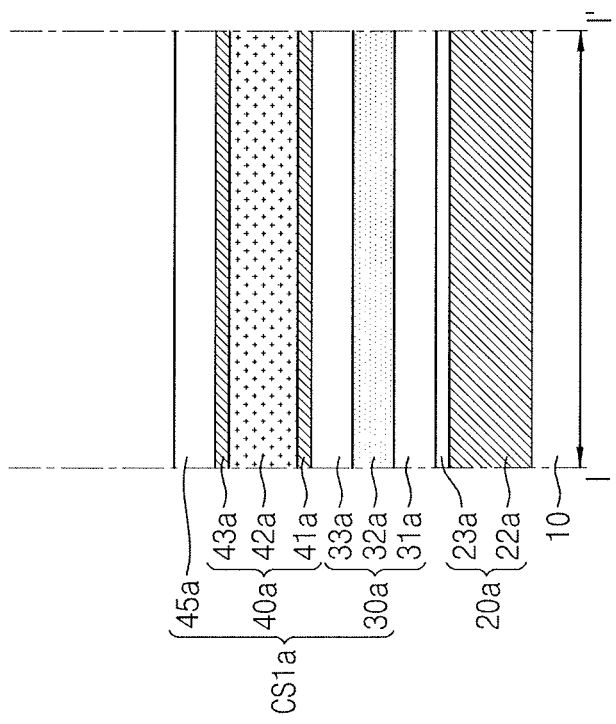

Referring to FIGS. 4A and 4B, a method of forming a cross-point type semiconductor memory device 100A may include forming a word line material layer 20a and a cell stack material layer CS1a on an underlayer 10.

The underlayer 10 may include a substrate or an insulating material layer formed on the substrate. For example, the underlayer 10 may include a silicon substrate, a silicon dioxide (SiO$_2$) layer, a silicon nitride (SiN) layer, or other insulating material layers.

Forming the word line material layer 20a may include sequentially performing deposition processes to form a word line electrode material layer 22a and a word line barrier material layer 23a on the underlayer 10. The word line barrier material layer 23a may include, for example, a material such as titanium nitride (TiN) that prevents diffusion of atoms and enhances adhesion with the word line electrode material layer 22a and the cell stack material layer CS1a. The word line electrode material layer 22a may include a conductor having a low resistance. For example, the word line electrode material layer 22a may include a metal such as tungsten (W). In an example embodiment, a barrier material layer having the same material as the word line barrier material layer 23a may be further formed between the underlayer 10 and the word line electrode material layer 22a.

Forming the cell stack material layer CS1a may include forming a switching element material layer 30a and a memory element material layer 40a on the word line material layer 20a.

Forming the switching element material layer 30a may include performing deposition processes to sequentially form a lower electrode material layer 31a, a switching electrode material layer 32a, and an intermediate electrode material layer 33a on the word line material layer 20a. For example, the lower electrode material layer 31a and the intermediate electrode material layer 33a may include a non-metallic material such as carbon. In an example embodiment, the lower electrode material layer 31a and the intermediate electrode material layer 33a may include an N-doped carbon. For example, the N-doped carbon may include N-type impurities such as phosphorous (P), arsenic (As), and/or antimony (Sb). The switching electrode material layer 32a may include an ovonic threshold switch (OTS) material.

Forming the memory element material layer 40a may include performing deposition processes to sequentially form a lower interface material layer 41a, a memory cell material layer 42a, an upper interface material layer 43a, and an upper electrode material layer 45a. Forming the lower interface material layer 41a and the upper interface material layer 43a may include performing a deposition process to form a metal layer, such as tungsten (W). Forming the memory cell material layer 42a may include performing a deposition process to form a resistance changeable material, a phase changeable material, a magneto-resistance changeable material, a conductive bridge material, or various other variable resistance materials. Forming the upper electrode material layer 45a may include performing a deposition process to form a non-metallic material layer including a material such as carbon. The upper electrode material layer 45a may include the same material as the lower electrode material layer 31a or the intermediate electrode material layer 33a.

Figure 5A:
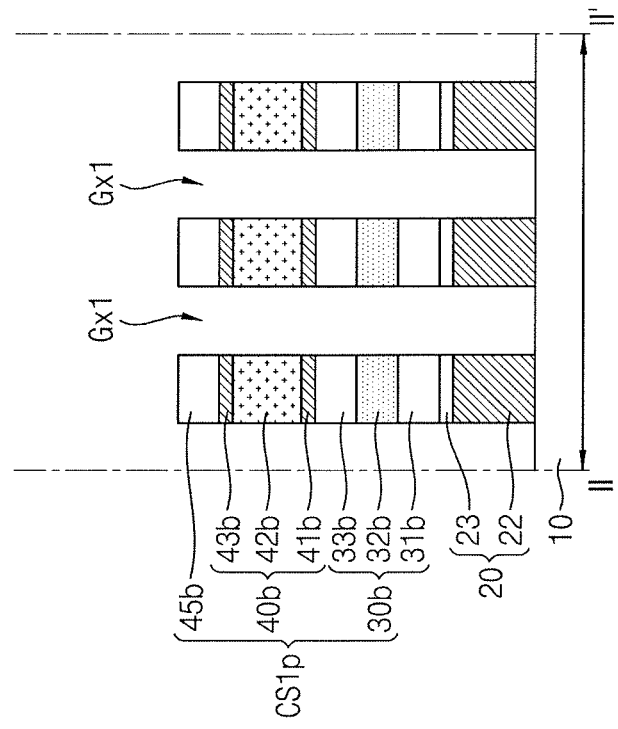
Figure 5B:
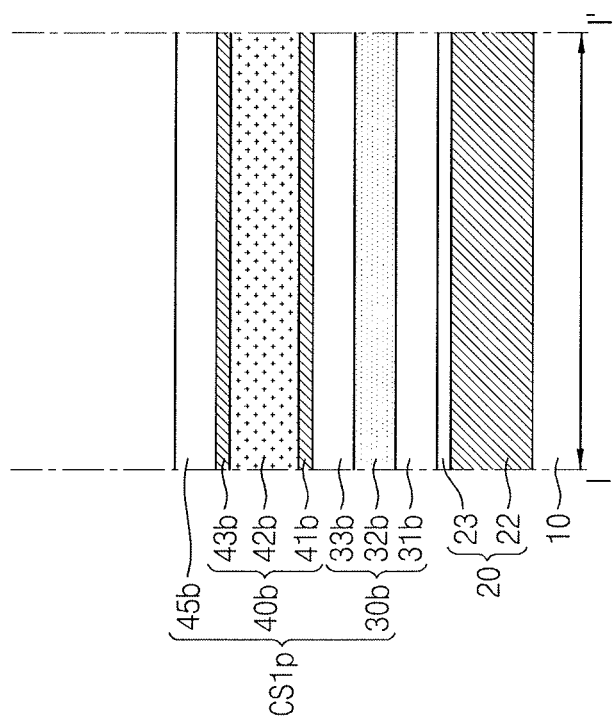

Referring to FIGS. 5A and 5B, the method may include patterning the cell stack material layer CS1a and the word line material layer 20a by performing an X-directional trimming process to form a preliminary cell stack CS1p and a word line 20. The preliminary cell stack CS1p may include a preliminary switching element 30b and a preliminary memory element 40b. The preliminary switching element 30b may include a preliminary lower electrode 31b, a preliminary switching electrode 32b, and a preliminary intermediate electrode 33b. The preliminary memory element 40b may include a preliminary lower interface 41b, a preliminary memory cell 42b, a preliminary upper interface 43b, and a preliminary upper electrode 45b. The word line 20 may include a word line electrode 22 and a word line barrier 23. The preliminary cell stack CS1p may have a dam or wall shape extending in the X-direction. The word line 20 may horizontally extend in the X-direction. X-directional gaps Gx1 having a trench shape extending in the X-direction may be formed between the preliminary cell stacks CS1p to selectively expose surfaces of the underlayer 10.

Referring to 6A and 6B, the method may include conformally forming an X-directional spacer Sx1 on both or opposite sidewalls of the word line 20 and the preliminary cell stack CS1p. The X-directional spacer Sx1 may extend in the X-direction along the word line 20 and the preliminary cell stack CS1p. The X-directional spacer Sx1 may include an insulating material such as silicon nitride (SiN).

Referring to FIGS. 7A and 7B, the method may include performing a lower X-directional gap-fill process to form a lower X-directional gap-fill insulator 51x that fills the X-directional gaps Gx1.

The lower X-directional gap-fill process may be performed using a first source gas. The first source gas may include a first precursor and a second precursor. The first precursor may be suitable for forming a layer of gap-fill material having a relatively good flowability or low viscosity, and the second precursor may be suitable for forming a layer of gap-fill material having a relatively low flowability or good viscosity. The first precursor may include, for example, octamethylcyclotetrasilioxane (OMCTS), and the second precursor may include, for example, tetramethoxysilane or tetramethylorthosilicate (TMOS).

In the first source gas, a volume ratio of the first precursor to the second precursor may be greater than 15:1. For example, the volume ratio of the first precursor to the second precursor may be about 20:1 to 50:1. The lower X-directional gap-fill insulator 51x formed by the lower X-directional gap-fill process may have excellent flowability and appropriate amount of the second precursor. Accordingly, the lower X-directional gap-fill insulator 51x may sufficiently fill the X-directional gap Gx1 between the preliminary cell stacks CS1p in the cell area CA before leaking to a peripheral area PA.

Referring to FIG. 7C, the lower X-directional gap-fill insulator 51x may fill the X-directional gaps Gx1 in a cell area CA, and may be slightly thinly formed on the underlayer 10 in the peripheral area PA. For example, the lower X-directional gap-fill insulator 51x may be coplanar or slightly thicker with the top surface of the preliminary upper electrode 45b of the preliminary cell stack CS1p. In the present example embodiment, the top surface of the lower X-directional gap-fill insulator 51x is shown to be located at a level slightly higher than the top surface of the preliminary upper electrode 45b.

In the lower X-directional gap-fill process, the word line 20 and the preliminary cell stack CS1p may have a dam shape extending in the X-direction. Thus, the lower X-directional gap-fill insulator 51x may quickly fill the X-directional gaps Gx1 in the cell area CA. The lower X-directional gap-fill insulator 51x may be formed in the cell area CA much faster than in the peripheral area PA.

In the first source gas, when the volume ratio of the first precursor is excessively high, the lower X-directional gap-fill insulator 51x may leak into the peripheral area PA before filling the X-directional gaps Gx1. If the volume ratio of the first precursor is not high enough, the lower X-directional gap-fill insulator 51x may not sufficiently fill the X-directional gaps Gx1, and a seam or void may be generated and an over-hang shape may be formed at top position of the preliminary cell stack CS1p.

Figure 8B:
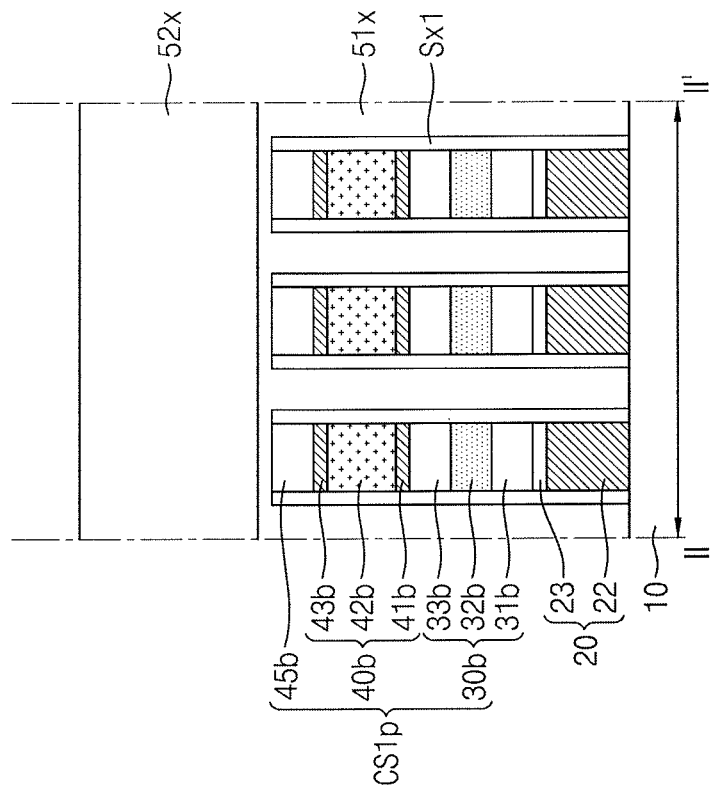
Figure 8A:
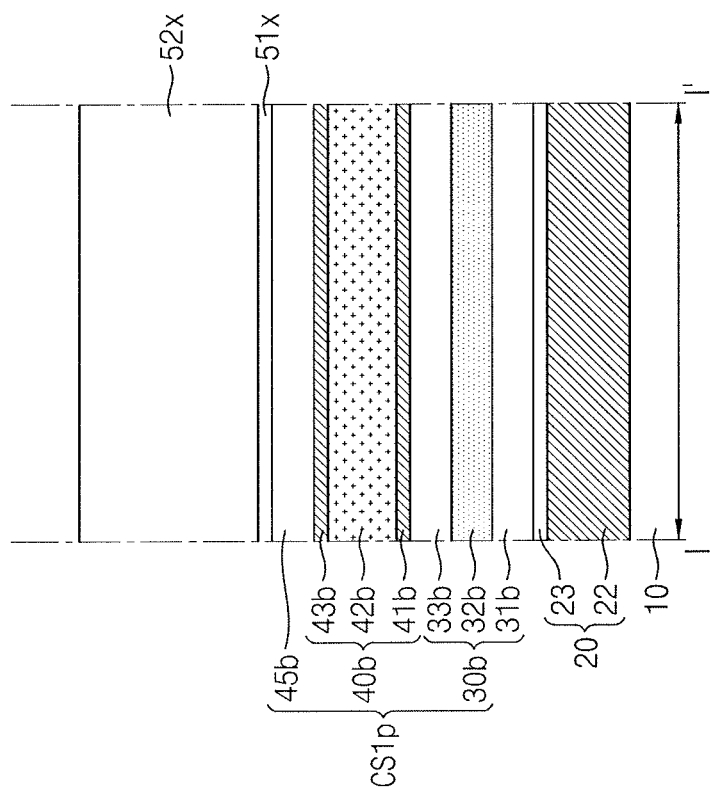

Referring FIGS. 8A and 8B, the method may include performing an upper X-directional gap-fill process to form an upper X-directional gap-fill insulator 52x on the lower X-directional gap-fill insulator 51x. The upper X-directional gap-fill process may be performed using a second source gas. The second source gas may also include the first precursor and the second precursor. In the second source gas, a volume ratio of the first precursor to the second precursor may be less than 15:1, for example, the volume ratio of the first precursor to the second precursor may be about 1:1 to 10:1, and, in an example embodiment, the second source gas includes the second precursor at a higher volume ratio than the first source gas.

Referring to FIG. 8C, the upper X-directional gap-fill insulator 52x may have excellent conformability overall. For example, the upper X-directional gap-fill insulator 52x may be formed to have a substantially uniform or similar thickness in the cell area CA and the peripheral area PA. The upper X-directional gap-fill insulator 52x may have a sufficiently thick thickness.

According to the present example embodiment, the second source gas includes the second precursor at a higher volume ratio than the first source gas. Thus, the upper X-directional gap-fill insulator 52x may have relatively better conformability than the lower X-directional gap-fill insulator 51x. Accordingly, the upper X-directional gap-fill insulator 52x may be formed to a sufficient thickness on the lower X-directional gap-fill insulator 51x in the cell area CA. In the present example embodiment, the upper X-directional gap-fill insulator 52x substantially covers the lower X-directional gap-fill insulator 51x without filling the X-directional gaps Gx1, but it may be referred to as a gap-fill insulator rather than a covering insulator.

In an example embodiment, the volume of the lower X-directional gap-fill insulator 51x is reduced when the curing process is performed. Thus, the upper X-directional gap-fill insulator 52x may partially fill the inside of the X-directional gap Gx1.

Figure 9A:
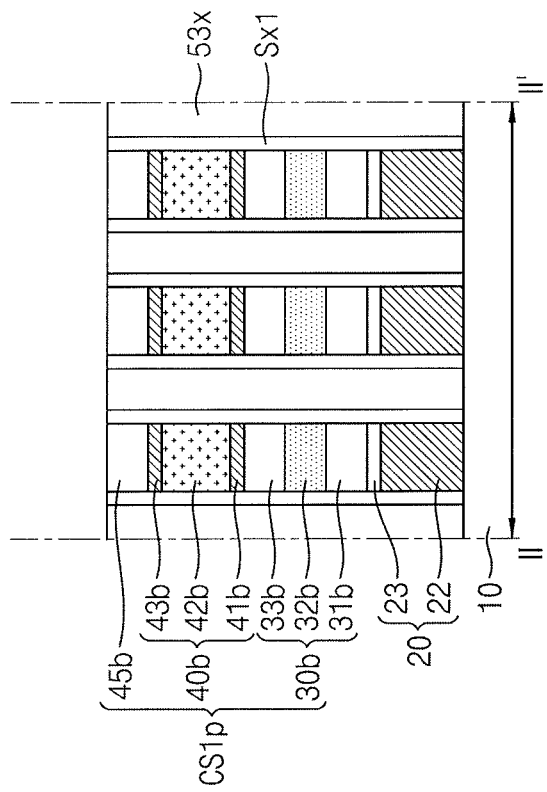
Figure 9B:
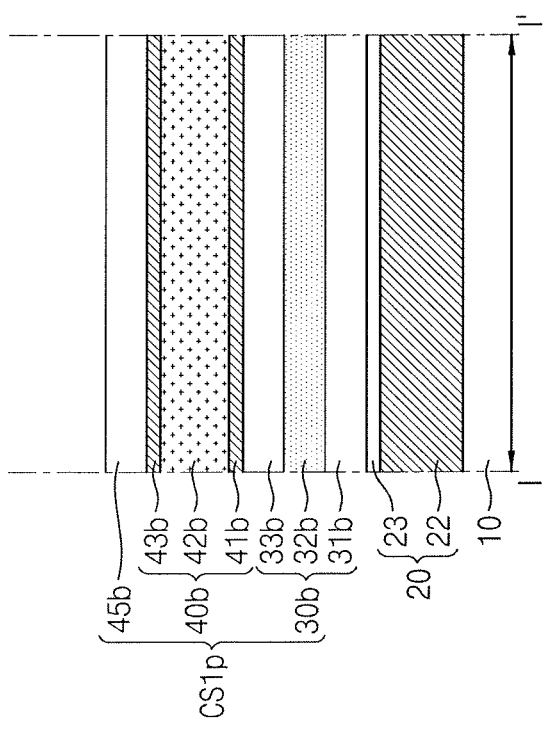

Referring to FIGS. 9A and 9B, the method may include curing and planarizing the lower X-directional gap-fill insulator 51x and the upper X-directional gap-fill insulator 52x by performing a curing process and a planarization process to form an X-directional gap-fill insulator 53x. The curing process may include a UV-curing process using ultra-violet (UV) light. The UV-curing process may discharge internal moisture or solvent components to the outside more effectively in a shorter time than ammonia ($NH_3$) curing process and a thermal curing process. The planarization process may include a chemical mechanical polishing (CMP) process.

Referring again to FIG. 8C, the upper X-directional gap-fill insulator 52x is formed to be sufficiently thick in order to compensate for volume reduction during curing of the lower X-directional gap-fill insulators 51x and the upper X-directional gap-fill insulators 52x. If the upper X-directional gap-fill insulator 52x is not sufficiently formed on the lower X-directional gap-fill insulator 51x, the X-directional gap-fill insulator 53x may not sufficiently fill the X-directional gaps Gx1, or a seam or void may be formed in the X-directional gaps Gx1.

Referring again to FIGS. 9A and 9B, in this process, the top surface of the X-directional gap-fill insulator 53x and the top surface of the preliminary upper electrode 45b may be coplanar.

Referring to FIGS. 10A and 10B, the method may include performing a deposition process to form a bit line material layer 50a on the preliminary upper electrode 45b and the X-directional gap-fill insulator 53x. The bit line material layer 50a may include a conductive material. In an example embodiment, the bit line material layer 50a may include a metal such as tungsten (W).

Figure 11A:
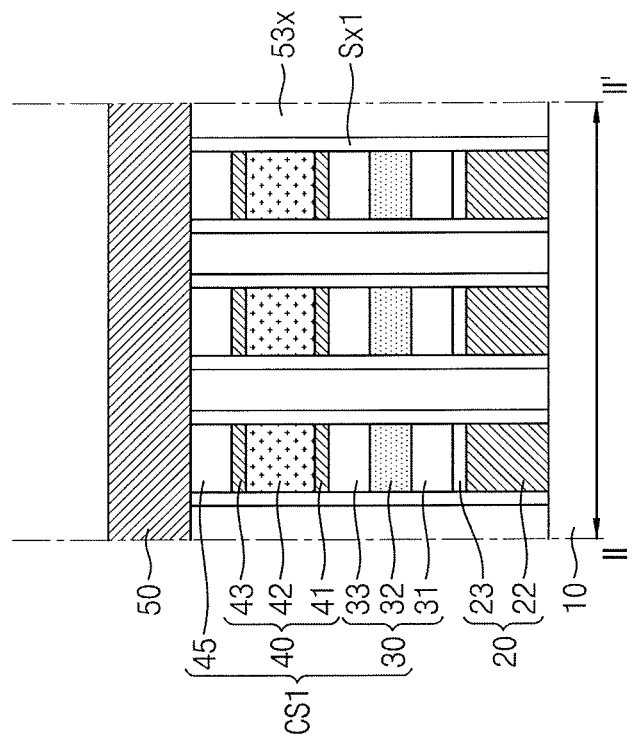
Figure 11B:
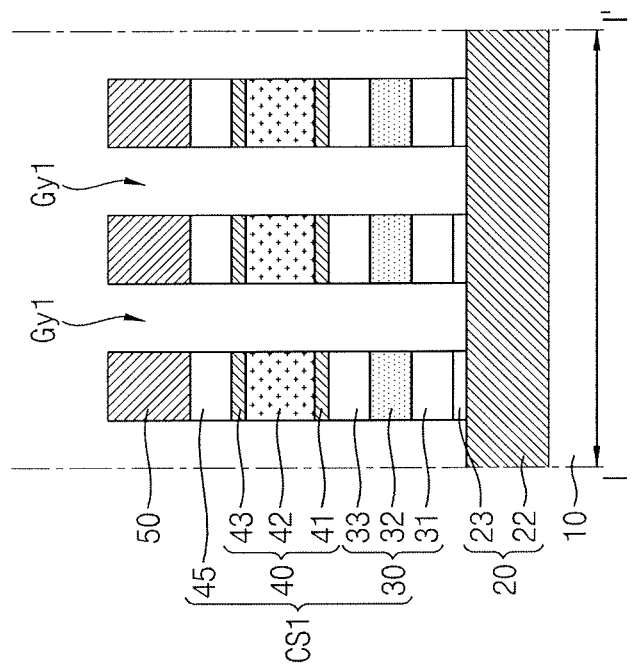

Referring to FIGS. 11A and 11B, the method may include selectively removing the bit line material layer 50a, the preliminary cell stack CS1p, the X-directional spacers Sx1, and the X-directional gap-fill insulator 53x by performing a Y-directional trimming process to form a bit line 50 and a cell stack CS1. The bit lines 50 may extend horizontally and parallel in the Y-direction. The cell stack CS1 may have a pillar shape. A Y-directional gaps Gy1 having a trench shape extending in the Y-direction may be formed between the cell stacks CS1 to selectively expose the surface of the word line 20.

Figure 12A:
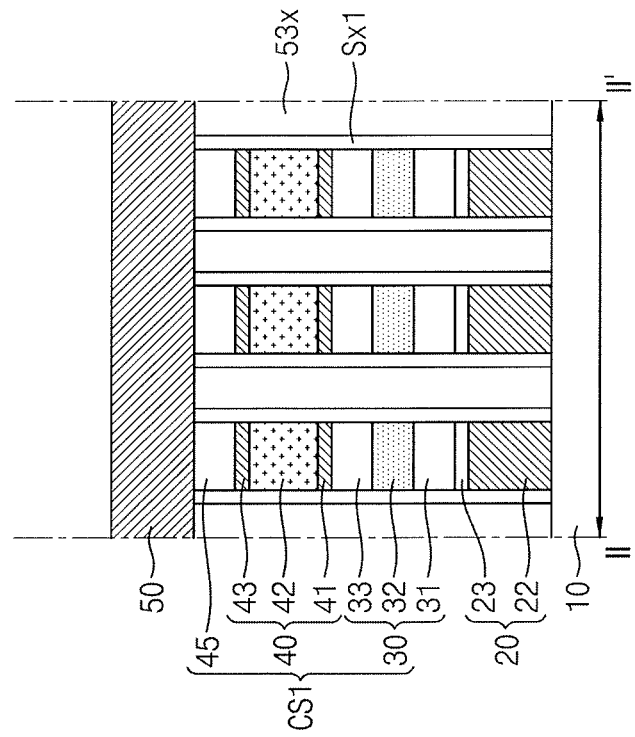
Figure 12B:
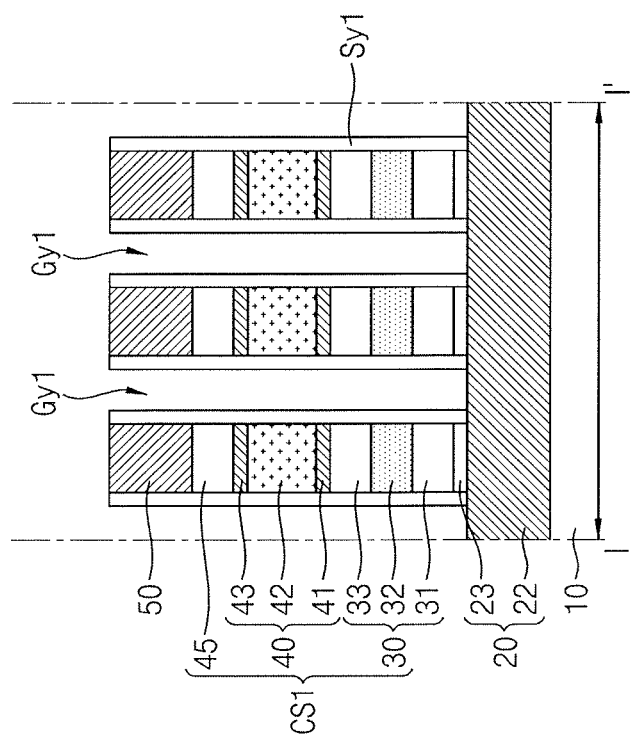

Referring to FIGS. 12A and 12B, the method may include conformally forming a Y-directional spacer Sy1 on both or opposite sidewalls of the bit line 50, the cell stack CS1, and the X-directional gap-fill insulator 53x. The Y-directional spacer Sy1 may extend in the Y-direction along the cell stack CS1, the bit line 50, and the X-directional gap-fill insulator 53x. The Y-directional spacer Sy1 may include an insulating material such as silicon nitride (SiN).

Figure 13A:
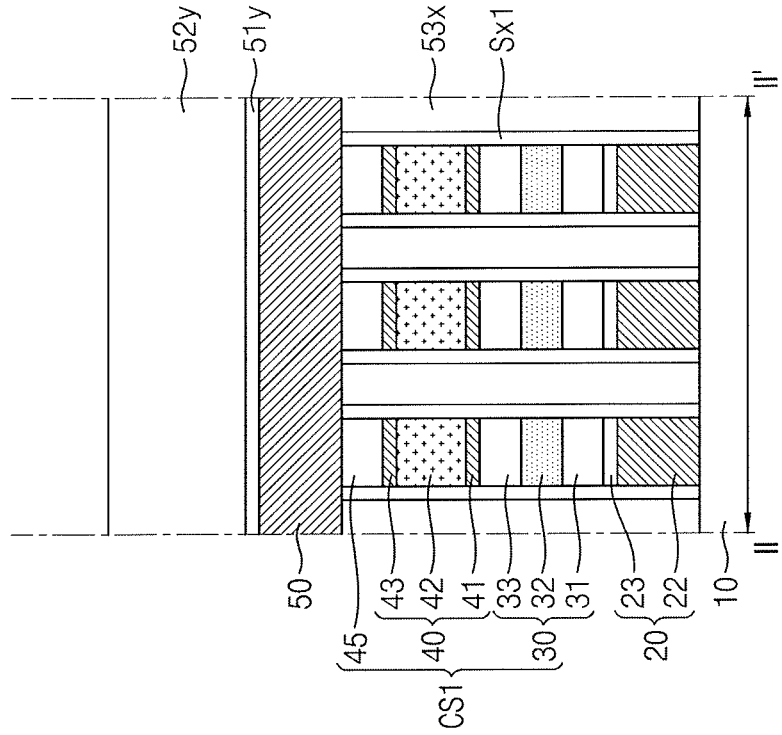
Figure 13B:
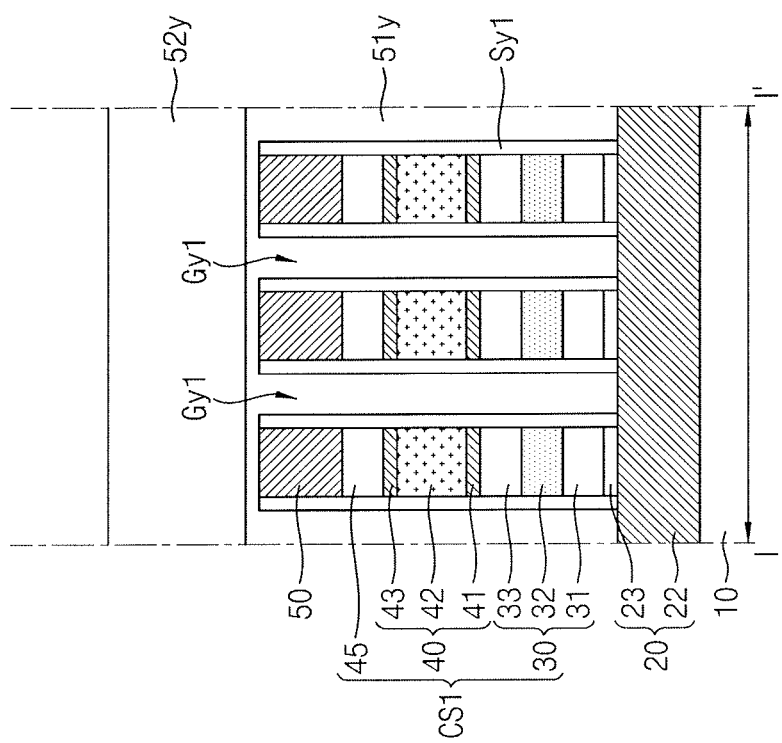

Referring to FIGS. 13A and 13B, the method may include performing a lower Y-directional gap-fill process to form a lower Y-directional gap-fill insulator 51y filling the Y-directional gaps Gy1, and an upper Y-directional gap-fill process to form an upper Y-directional gap-fill insulator 52y on the lower Y-directional gap-fill insulator 51y. The lower Y-directional gap-fill process may be performed under process conditions substantially the same as or similar to the lower X-directional gap-fill process described above. For example, the lower Y-directional gap-fill process may be performed using a third source gas that is substantially the same as the first source gas. The profile of the lower Y-directional gap-fill insulator 51y may be understood with reference to FIG. 7C.

For example, the lower Y-directional gap-fill insulator 51y may fill the Y-directional gaps Gy1 in the cell area CA and may be thinly formed in the peripheral area PA. The lower Y-directional gap-fill insulator 51y may be coplanar with or slightly thicker than the top surface of the bit lines 50. In the embodiment, it is shown that the top surface of the lower Y-directional gap-fill insulator 51y is located at a level slightly higher than the top surface of the bit line 50.

The upper Y-directional gap-fill process may be performed under process conditions substantially the same as the lower Y-directional gap-fill process described above. For example, the upper Y-directional gap-fill process may be performed using a fourth source gas that is substantially the same as the second source gas.

A profile of the upper Y-directional gap-fill insulator 52y may be understood with reference to FIG. 8C. The upper Y-directional gap-fill insulator 52y may have good conformability overall. The upper Y-directional gap-fill insulator 52y may be sufficiently thick.

Referring to FIGS. 14A and 14B, the method may include curing the lower Y-directional gap-fill insulator 51y and the upper Y-directional gap-fill insulator 52y by performing a curing process and a planarization process to form a Y-directional gap-fill insulator 53y. In this process, the upper surfaces of the Y-directional spacer Sy1, the Y-directional gap-fill insulator 53y, and the bit line 50 may be coplanar.

Subsequently, referring again to FIGS. 2A and 2B, the method may further include forming a capping liner 95 and a capping insulator 96 on the X-directional gap-fill insulator 53x, the Y-directional gap-fill insulator 53y, and the bit line 50, which are planarized. Forming the capping liner 95 may include performing a deposition process to conformally form an insulator on the X-directional gap-fill insulator 53x, the Y-directional gap-fill insulator 53y, and the bit line 50. For example, the capping liner 95 may include silicon nitride (SiN), which may be denser than the X-directional gap-fill insulator 53x and the Y-directional gap-fill insulator 53y. Forming the capping insulator 96 may include performing a deposition process to form an insulator layer thicker than the capping liner 95. For example, the capping insulator 96 may include silicon dioxide (SiO$_2$), which may be softer than the capping liner 95.

FIGS. 15A and 15B to 24A and 24B are diagrams for describing a method of forming a cross-point type semiconductor memory device 100B in accordance with an example embodiment. In the following, brief reference will again be made to the processes described above beginning with FIGS. 4A and 4B, and then formation of a second cell stack according to the present example embodiment will be described.

In the present example embodiment, the method may include performing the processes described above with reference to FIGS. 4A and 4B to form a first word line material layer 20a and a first cell stack material layer CS1a on an underlayer 10. Forming the first word line material layer 20a may include forming a first word line electrode material layer 22a and a first word line barrier material layer 23a. Forming the first cell stack material layer CS1a may include forming a first switching element material layer 30a and a first memory element material layer 40a on the first word line material layer 20a. Forming the first switching element material layer 30a may include performing a deposition process to sequentially form a first lower electrode material layer 31a, a first switching electrode material layer 32a, and a first intermediate electrode material layer 33a. Forming the first memory element material layer 40a may include performing a deposition process to sequentially form a first lower interface material layer 41a, a first memory cell material layer 42a, a first upper interface material layer 43a.

Subsequently, the method may include:

forming a first preliminary cell stack CS1p, a first word line 20, and a first X-directional gap Gx1 by patterning the first cell stack material layer CS1a and the first word line material layer 20a by performing a first X-directional trimming process described with reference to FIGS. 5A and 5B, conformally forming a first X-directional spacer Sx1 on both or opposite sidewalls of the first preliminary cell stack CS1p by performing the processes described with reference to FIGS. 6A and 6B, forming a first lower X-directional gap-fill insulator 51x that fills the first X-directional gap Gx1 by performing the processes described with reference to FIGS. 7A to 7C, forming a first upper X-directional gap-fill insulator 52x on the first lower X-directional gap-fill insulator 51x by performing a first upper X-directional gap-fill processes described with reference to FIGS. 8A to 8C, forming a first X-directional gap-fill insulator 53x by performing the processes described with reference to FIGS. 9A and 9B, forming a common bit line material layer 50a on the first preliminary upper electrode 45b on the first preliminary cell stack CS1p and the first X-directional gap-fill insulator 53x by performing the processes described with reference to FIGS. 10A and 10B, forming a common bit line 50, a first cell stack CS1, a first Y-directional gap Gy1 by patterning the common bit line material layer 50a, the first preliminary cell stack CS1p, the first X-directional spacer Sx1, and the first X-directional gap-fill insulator 53x by performing the first Y-directional trimming process with reference to FIGS. 11A and 11B, conformally forming a first Y-directional spacer Sy1 on both or opposite sidewalls of the first cell stack CS1 and the common bit line 50 by performing the processes described with reference to FIGS. 12A and 12B, forming a first lower Y-directional gap-fill insulator 51y and a first upper Y-directional gap-fill insulator 52y by performing the processes described with reference to FIGS. 13A and 13B, and forming the first Y-directional gap-fill insulator 53y by performing the processes described with reference to FIGS. 14A and 14B.

Figure 15A:
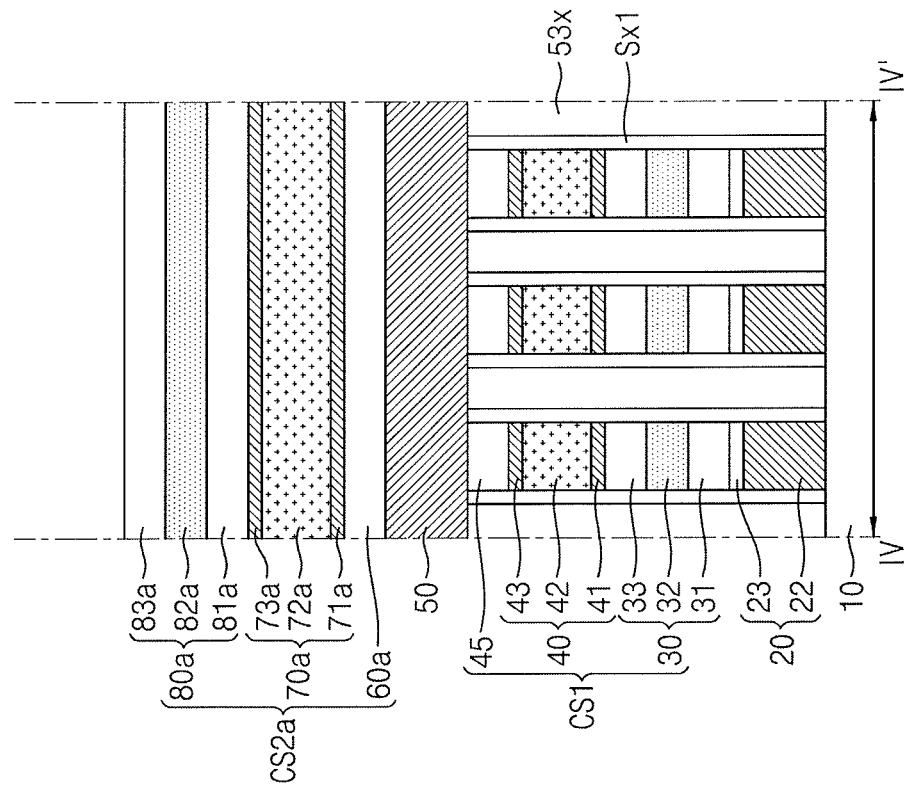
Figure 15B:
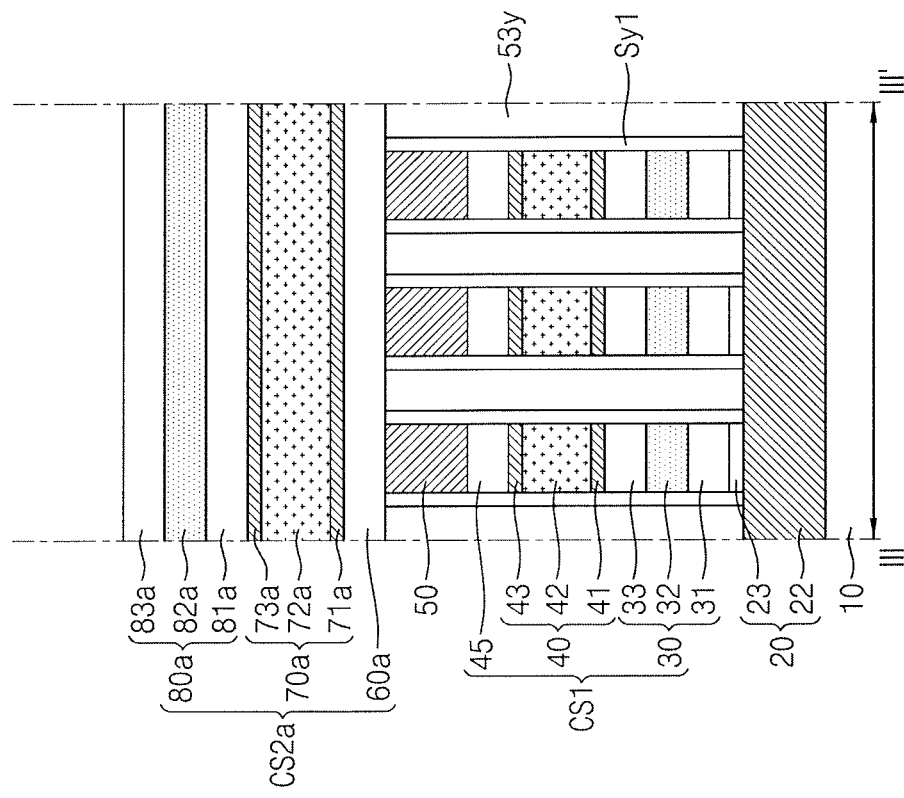

In the present example embodiment, referring to FIGS. 15A and 15B, the method may include subsequently forming a second cell stack material layer CS2a on the common bit line 50 and the first upper Y-directional gap-fill insulator 52y by performing a deposition process. The second cell stack material layer CS2a may include a second memory element material layer 70a and a second switching element material layer 80a. The second memory element material layer 70a may include a second lower electrode material layer 60a, a second lower interface material layer 71a, a second memory cell material layer 72a, and a second upper interface material layer 73a. The second switching element material layer 80a may include a second intermediate electrode material layer 81a, a second switching material layer 82a, and a second upper electrode material layer 83a. The second lower electrode material layer 60a may include the same material as the first upper electrode material layer 45a, the second lower interface material layer 71a may include the same material as the first upper interface material layer 43a, the second memory cell material layer 72a may include the same material as the first memory cell material layer 42a, the second upper interface material layer 73a may include the same material as the first lower interface material layer 41a, the second intermediate electrode material layer 81a may include the same material as the first intermediate electrode material layer 33a, the second switching material layer 82a may include the same material as the first switching electrode material layer 32a, and the second upper electrode material layer 83a may include the same material as the first lower electrode material layer 31a.

Referring to FIGS. 16A and 16B, the method may include forming a second preliminary cell stack CS2p by performing a second Y-directional trimming process. A second Y-directional gap Gy2 may be formed between the second preliminary cell stacks CS2p, and between the second preliminary lower electrodes 60b. Each of the second preliminary cell stacks CS2p may include a second preliminary lower electrode 60b, a second preliminary memory element 70b, and a second preliminary switching element 80b. The second preliminary memory element 70b may include a second preliminary lower interface 71b, a second preliminary memory cell 72b, and a second upper interface 73b. The second preliminary switching element 80b may include a second preliminary intermediate electrode 81b, a second preliminary memory cell 82b, and a second preliminary upper electrode 83b.

Figure 17A:
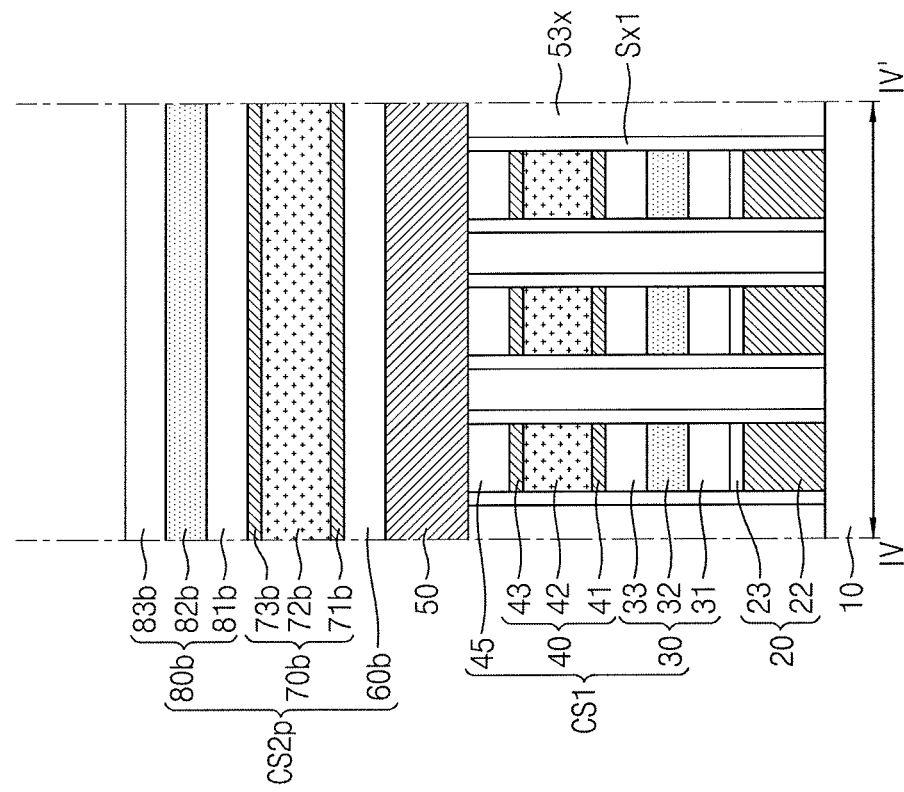
Figure 17B:
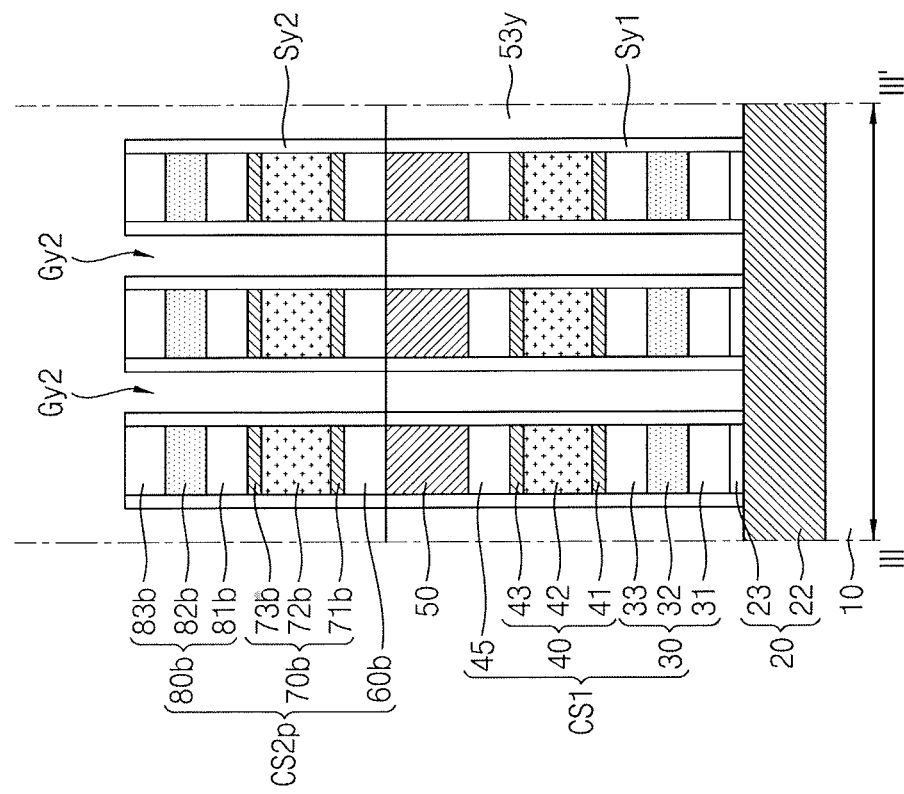

Referring to FIGS. 17A and 17B, the method may include conformally forming a second Y-directional spacer Sy2 on both or opposite sidewalls of the second preliminary cell stack CS2p.

Figure 18A:
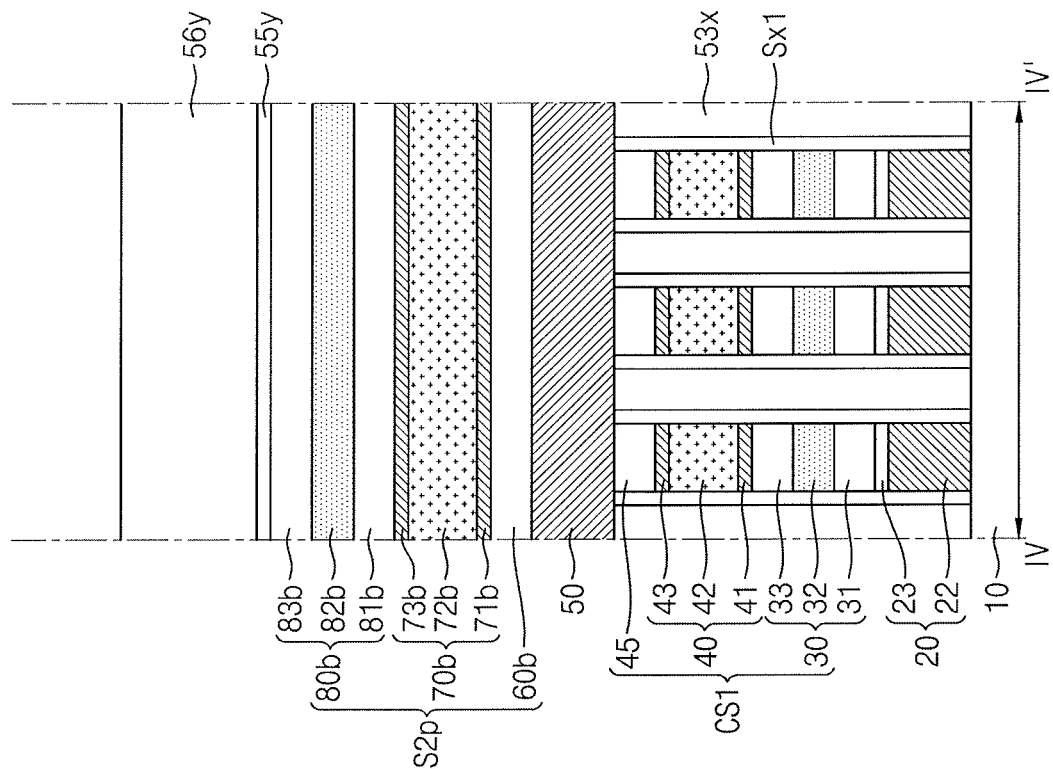
Figure 18B:
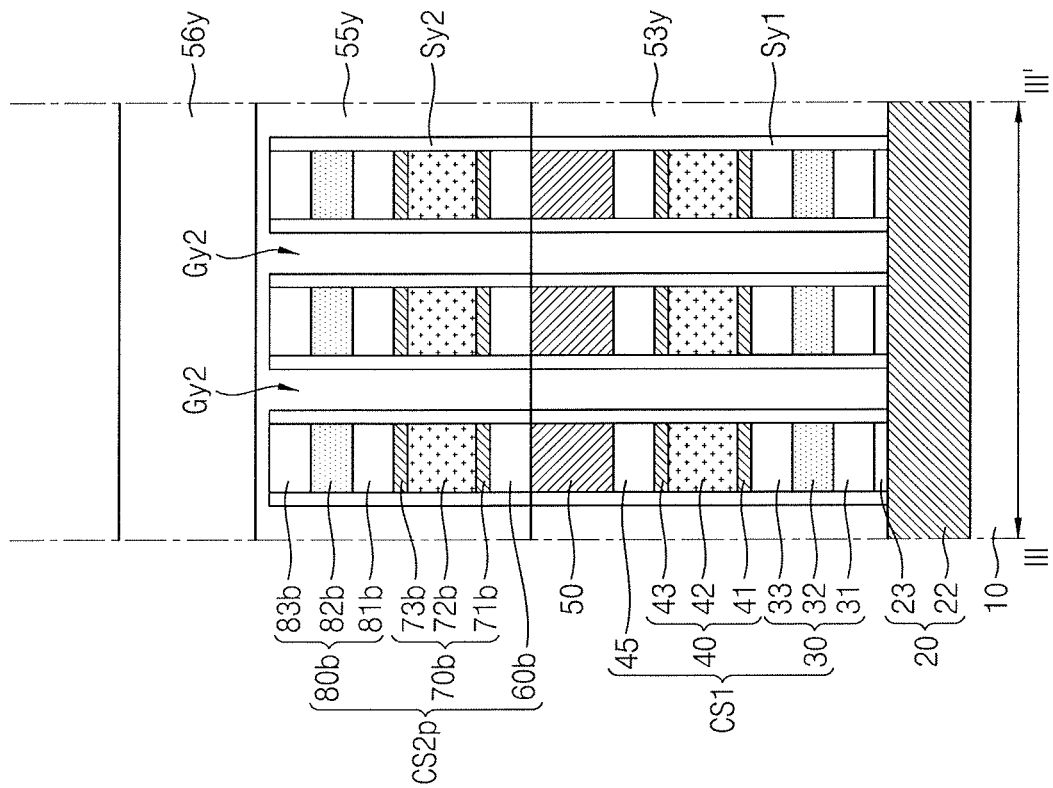

Referring to FIGS. 18A and 18B, the method may include forming a second lower Y-directional gap-fill insulator 55y and a second upper Y-directional gap-fill insulator 56y to fill the second Y-directional gap Gy2. This process may be understood in more detail with reference to FIGS. 7A to 7C and 8A to 8C.

For example, the second lower Y-directional gap-fill insulator 55y may be formed through a second lower Y-directional gap-fill process using a fifth source gas that is substantially the same as the first source gas, and the second upper Y-directional gap-fill insulator 56y may be formed through a second upper Y-directional gap-fill process using a sixth source gas that is substantially the same as the second source gas.

Figure 19A:
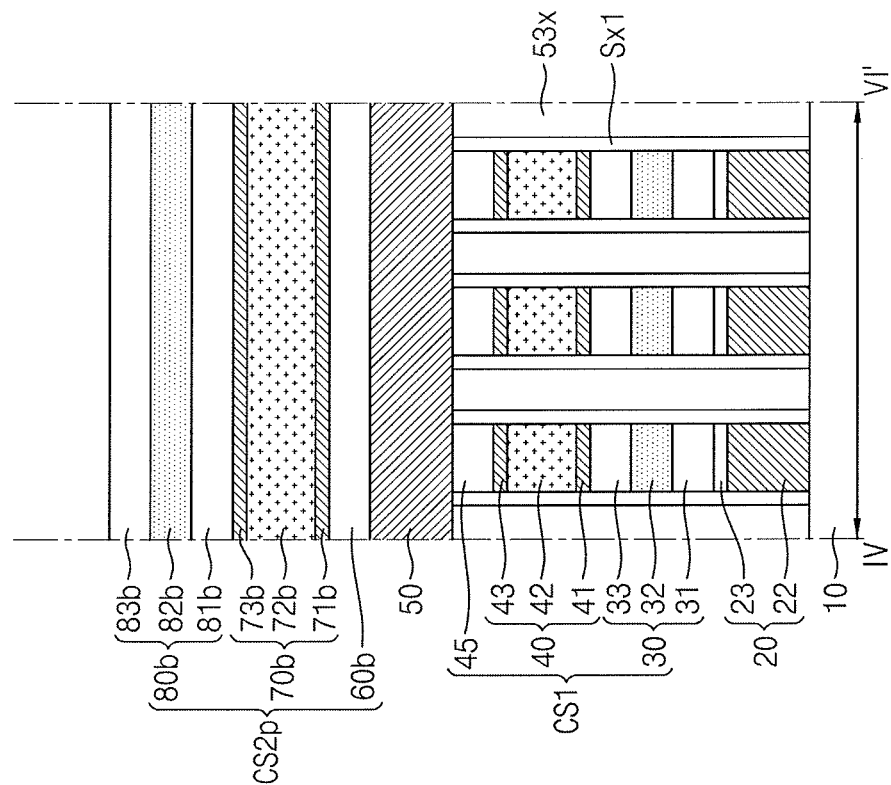
Figure 19B:
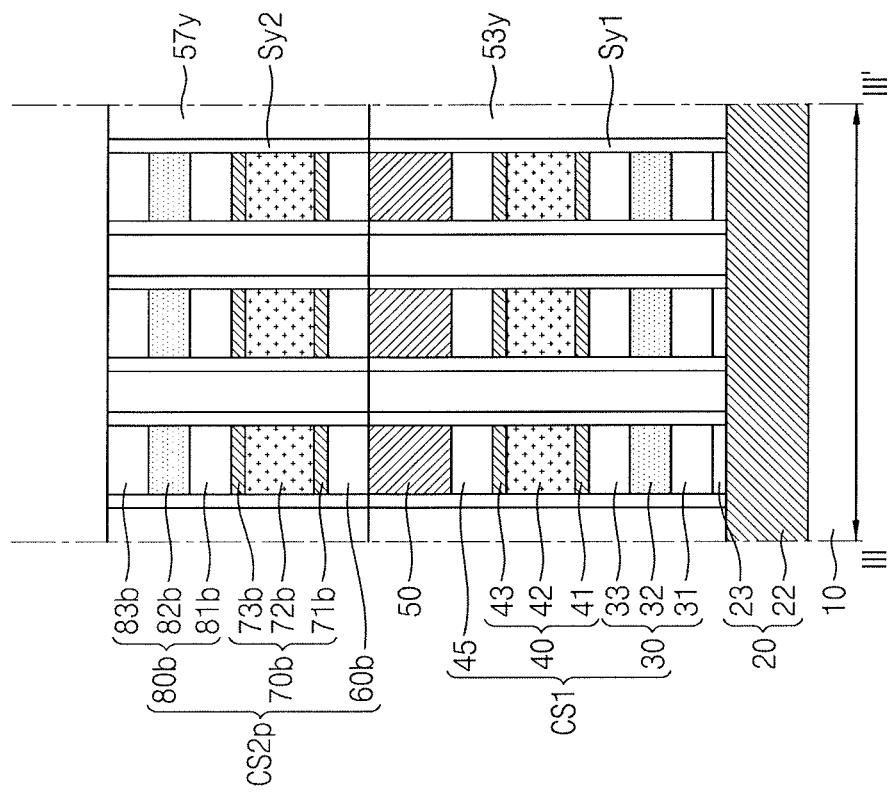

Referring to FIGS. 19A and 19B, the method may include forming a second Y-directional gap-fill insulator 57y by curing and planarizing the second lower Y-directional gap-fill insulator 55y and the second upper Y-directional gap-fill insulator 56y by performing a curing process and a planarization process.

Figure 20A:
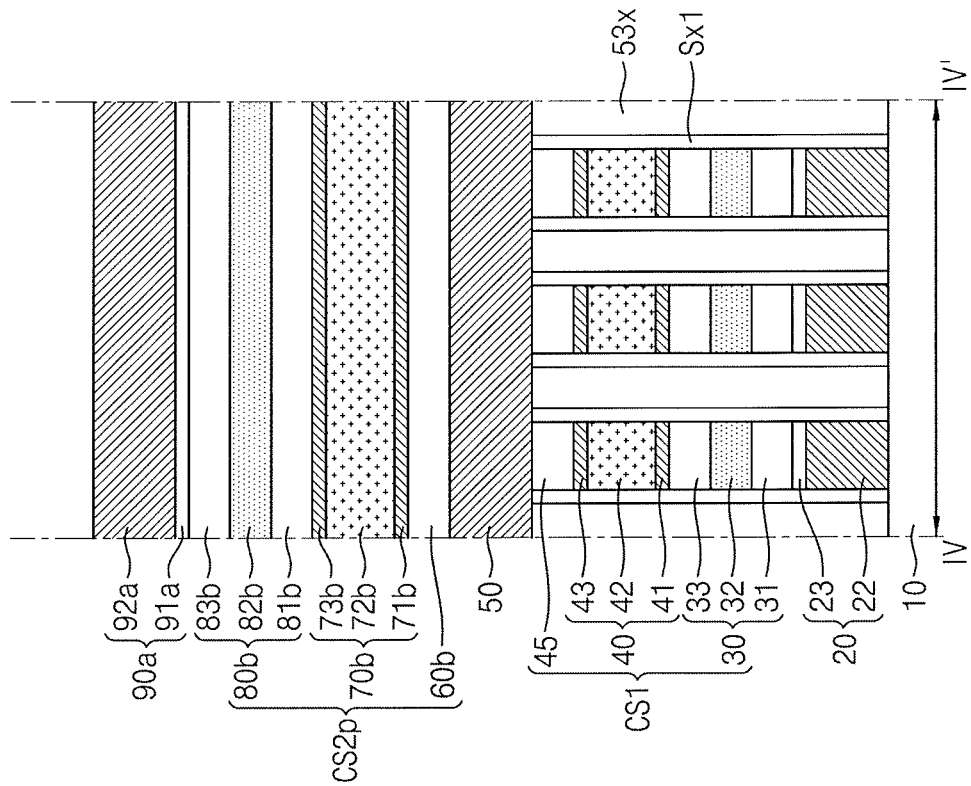
Figure 20B:
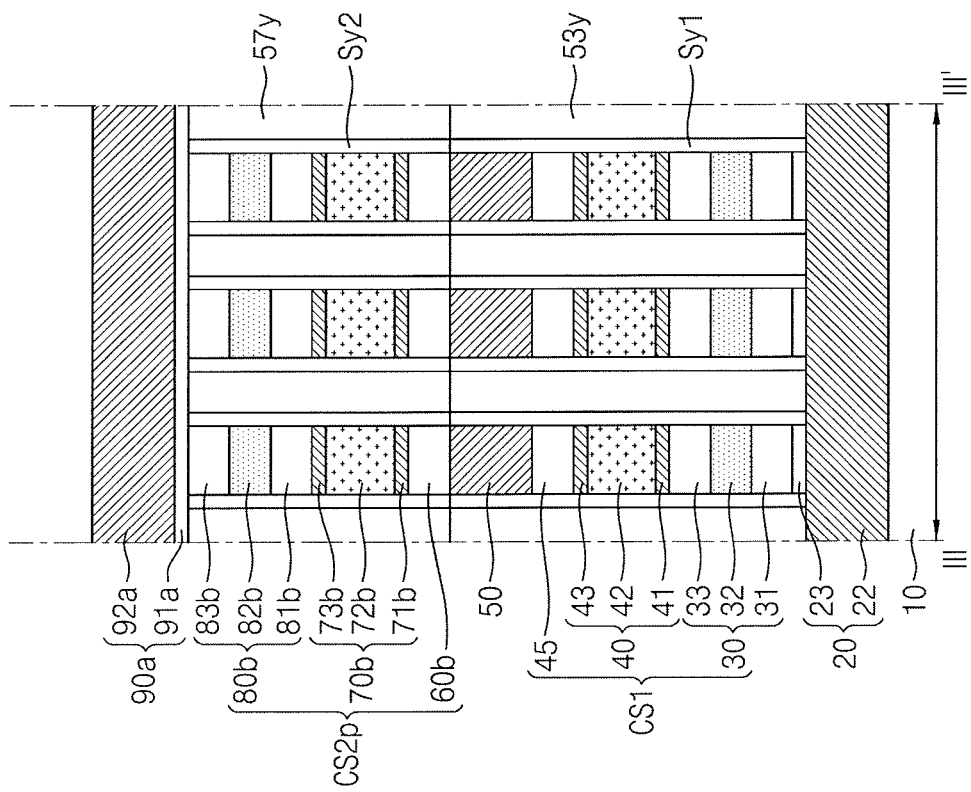

Referring to FIGS. 20A and 20B, the method may include forming a second word line material layer 90a on the second preliminary cell stack CS2p and the second Y-directional gap-fill insulator 57y. Forming the second word line material layer 90a may include forming a second word line barrier material layer 91a and a second word line electrode material layer 92a. The second word line barrier material layer 91a may include the same material as the first word line barrier material layer 23a, and the second word line electrode material layer 92a may include the first same material as the first word line electrode material layer 22a.

Figure 21A:
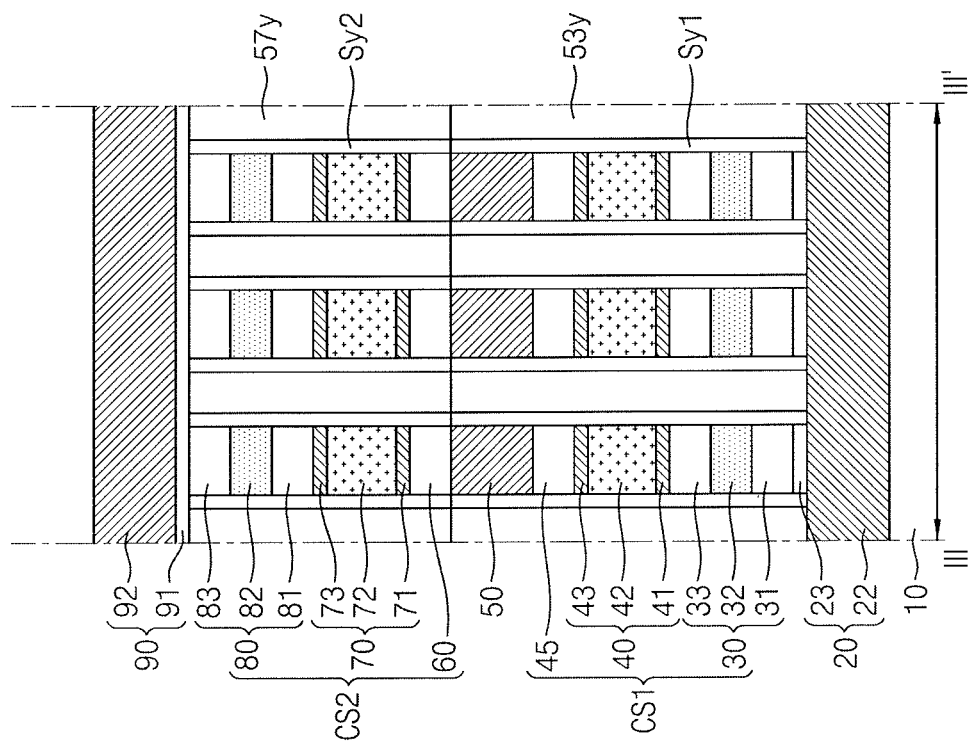
Figure 21B:
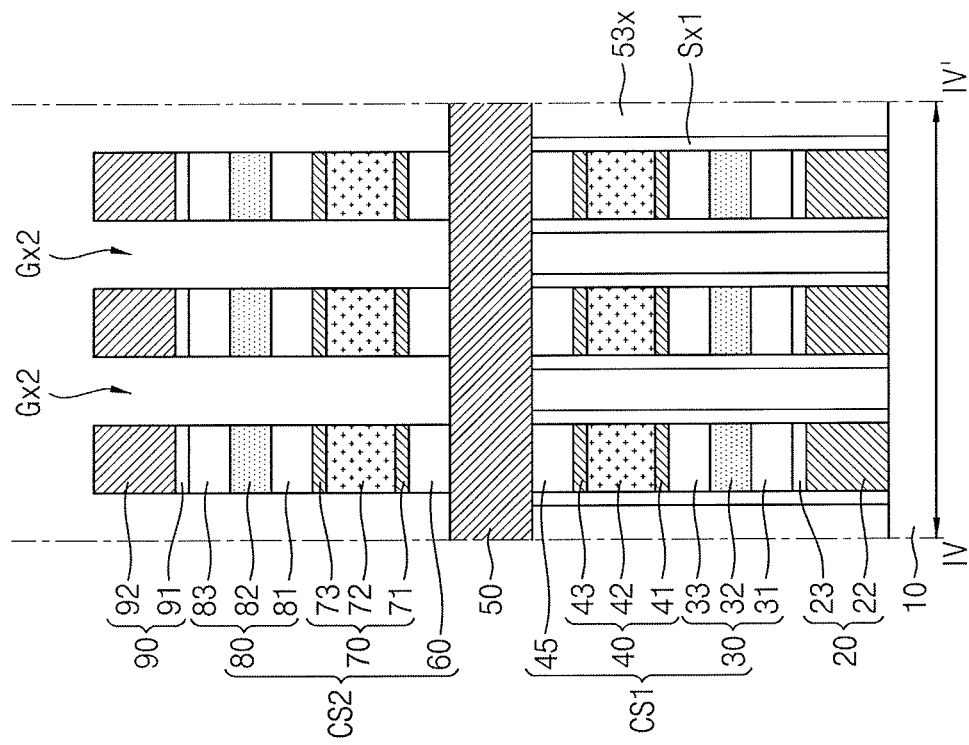

Referring to FIGS. 21A and 21B, the method may include forming a second word line 90 and a second cell stack CS2 by performing a second X-directional trimming process. A second X-directional gap Gx2 may be formed between the second cell stacks CS2. The second word line 90 may include a second word line barrier 91 and a second word line electrode 92.

Figure 22A:
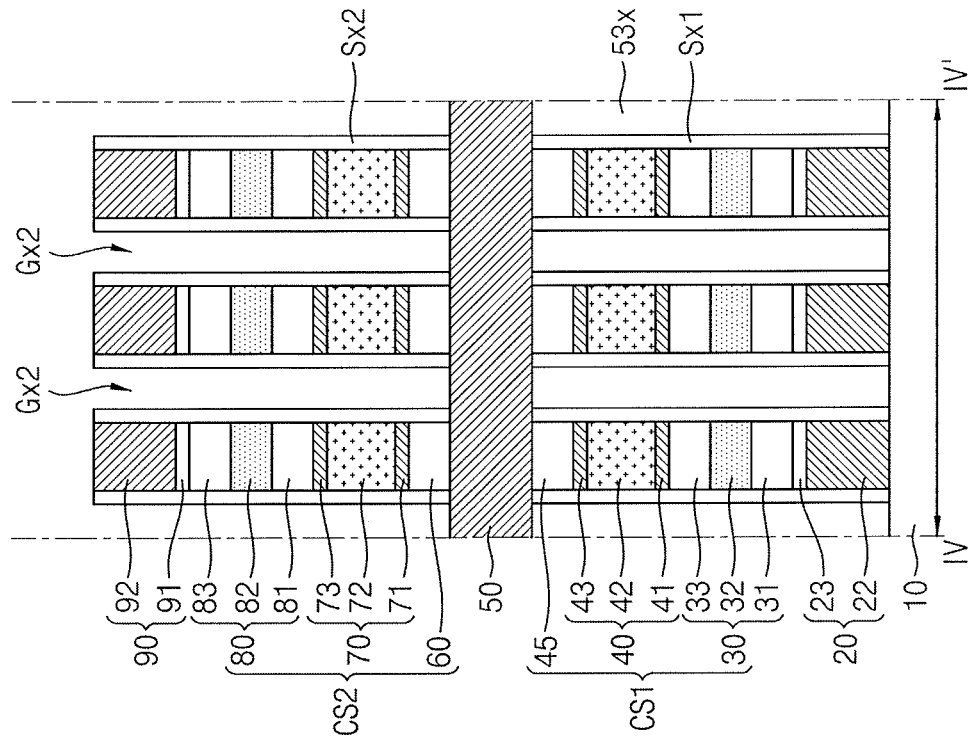
Figure 22B:
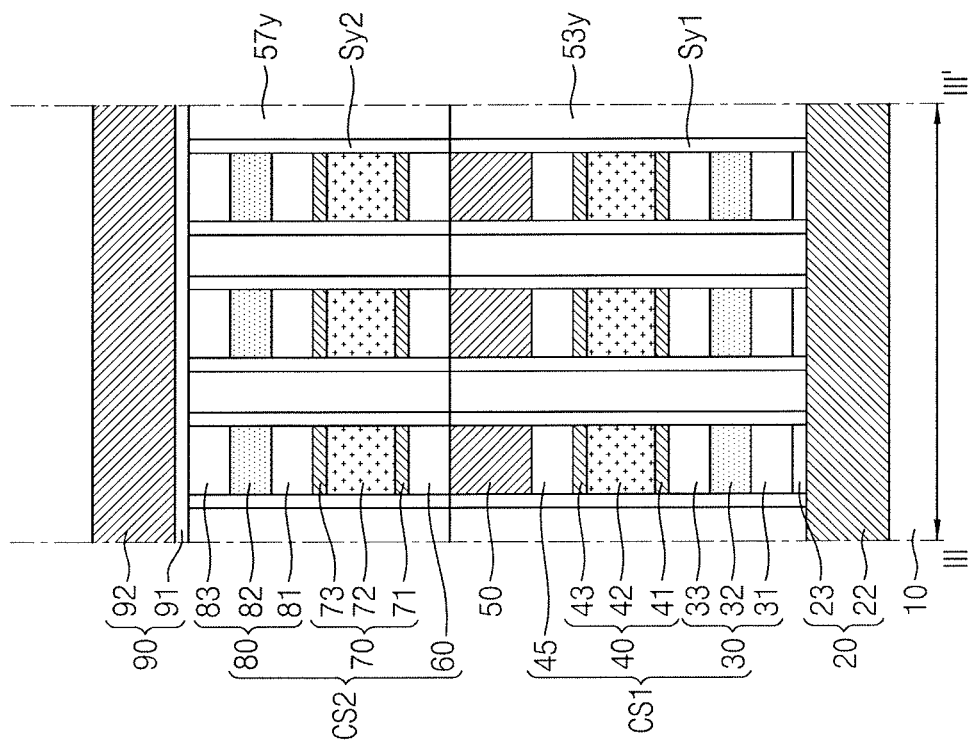

Referring to FIGS. 22A and 22B, the method may include conformally forming a second X-directional spacer Sx2 on both or opposite sidewalls of the second cell stack CS2 and the second word line 90.

Figure 23B:
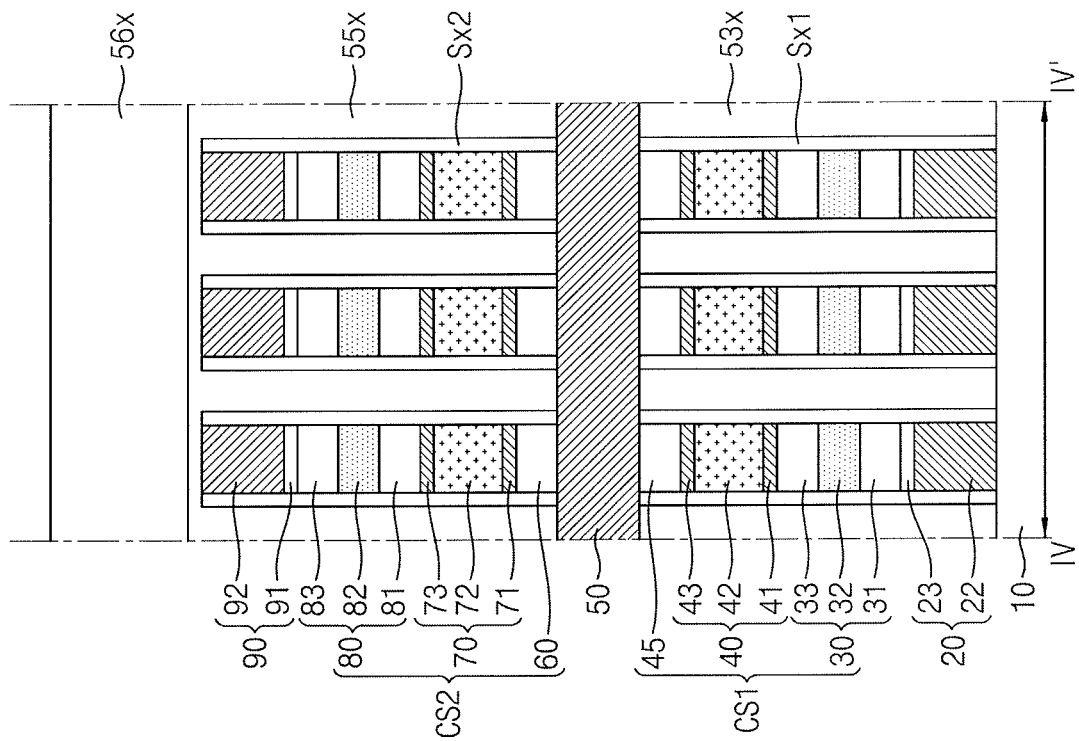
Figure 23A:
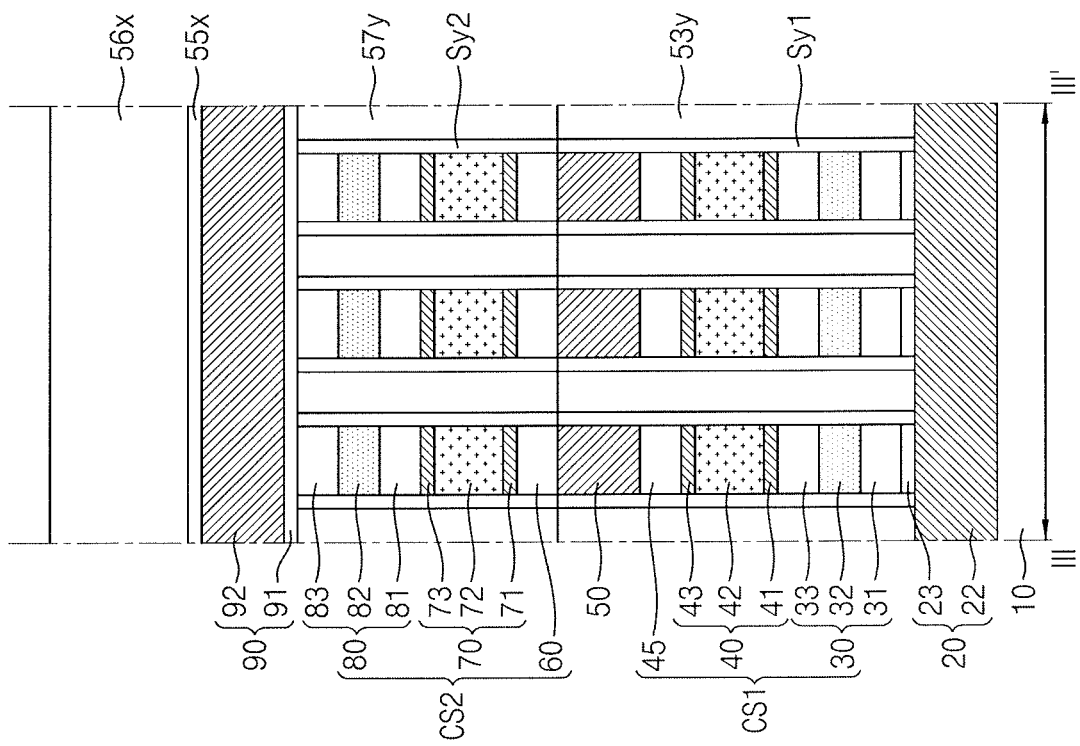

Referring to FIGS. 23A and 23B, the method may include a second lower X-directional gap-fill insulator 55x and a second upper X-directional gap-fill insulator 56x to fill the second X-directional gap Gx2. This process may be understood in more detail with reference to FIGS. 7A to 7C and 8A to 8C.

The second lower X-directional gap-fill insulator 55x may be formed through a second lower X-directional gap-fill process using a seventh source gas that is substantially the same as the first source gas, and the second upper X-directional gap-fill insulator 56x may be formed through a second upper X-directional gap-fill process using an eighth source gas that is substantially the same as the second source gas.

Referring to FIGS. 24A and 24B, the method may include forming a second X-directional gap-fill insulator by curing and planarizing the second lower X-directional gap-fill insulator 55x and the second upper X-directional gap-fill insulator 56x by performing a curing process and a planarization process.

Subsequently, referring to FIGS. 3A and 3B, the method may further include forming a capping liner 95 and a capping insulator 96 on the planarized second X-directional gap-fill insulator 57x and the second word line 90.

By way of summation and review, when an aspect ratio of gaps between cell stacks is increased, a process of filling a gap-fill insulator may become increasingly challenging to perform such that no seams or voids are formed in the gaps between the cell stacks.

As described above, embodiments may provide processes for filling gap-fill insulators in which seams or voids in gaps between cell stacks are reduced or eliminated, and block-level step differences are reduced or eliminated.

As described above, the gap-fill insulators may be filled in gaps without seams or voids between the cell stacks having a large aspect ratio, and a structural stability of the cell stacks may be enhanced. A two-step gap-fill process may be used to form a gap-fill insulator. The two-step gap-fill process may include a first step gap-fill process to form a lower gap-fill insulator in the gap and a second step gap-fill process to form an upper gap-fill insulator on the lower gap-fill insulator. The first gap-fill process may use a highly flowable insulator, and the second gap-fill process may use a highly viscous insulator. In a gap-fill process to fill a space between the cell stacks having a high aspect ratio, the gap-fill capability may be enhanced at the lower of the cell stacks, and a conformal insulating layer may be provided at the top of the cell stack, which may reduce a step difference in the block unit.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a cross-point type semiconductor memory device, the method comprising:
   forming a first word line material layer and a first cell stack material layer on an underlayer,
   patterning the first cell stack material layer and the first word line material layer to form first preliminary cell stacks, first word lines, and first X-directional gaps using a first X-directional trimming process, wherein the first preliminary cell stacks and the first word lines extend in an X-direction, and the first X-directional gaps extend in the X-direction between the first preliminary cell stacks,
   forming a first lower X-directional gap-fill insulator that fills the first X-directional gaps using a first lower X-directional gap-fill process,
   forming a first upper X-directional gap-fill insulator on the first lower X-directional gap-fill insulator using a first upper X-directional gap-fill process, and
   forming a first X-directional gap-fill insulator using a curing process and a planarization process on the first lower X-directional gap-fill insulator and the first upper X-directional gap-fill insulator,
   wherein:
   the first lower X-directional gap-fill process is performed using a first source gas that includes a first precursor and a second precursor, and
   the first upper X-directional gap-fill process is performed using a second source gas that includes the first precursor and the second precursor,
   a first volume ratio of the first precursor to the second precursor in the first source gas is greater than 15:1, and
   a second volume ratio of the first precursor to the second precursor in the second source gas is less than 15:1.

2. The method as claimed in claim 1, wherein the first precursor includes octamethylcyclotetrasilioxane.

3. The method as claimed in claim 1, wherein the second precursor includes at least one of tetramethoxysilane or tetramethylorthosilicate.

4. The method as claimed in claim 1, wherein:
   the first volume ratio of the first precursor to the second precursor in the first source gas is 20:1 to 50:1, and
   the second volume ratio of the first precursor to the second precursor in the second source gas is 1:1 to 10:1.

5. The method as claimed in claim 1, further comprising:
   forming a bit line material layer on the first preliminary cell stacks and the first X-directional gap-fill insulator,
   forming first cell stacks, bit lines, and first Y-directional gaps by patterning the bit line material layer and the first preliminary cell stacks using a first Y-directional trimming process, wherein the first cell stacks have a columnar shape, the bit lines extend in a Y-direction, and the first Y-directional gaps extend in the Y-direction between the first cell stacks,
   forming a first lower Y-directional gap-fill insulator that fills the first Y-directional gaps using a first lower Y-directional gap-fill process,
   forming a first upper Y-directional gap-fill insulator on the first lower Y-directional gap-fill insulator using a first upper Y-directional gap-fill process, and
   forming a first Y-directional gap-fill insulator using a curing process and a planarization process on the first lower Y-directional gap-fill insulator and the first upper Y-directional gap-fill insulator,
   wherein:
   the first lower Y-directional gap-fill process is performed using a third source gas that includes the first precursor and the second precursor, and
   the first upper Y-directional gap-fill process is performed using a fourth source gas that includes the first precursor and the second precursor,
   a third volume ratio of the first precursor to the second precursor in the third source gas is greater than 15:1, and
   a fourth volume ratio of the first precursor to the second precursor in the fourth source gas is less than 15:1.

6. The method as claimed in claim 5, wherein:
   the first cell stacks each include a first switching element, a first memory element, and a first upper electrode,
   the first switching element includes a first lower electrode, a first switching electrode, and a first intermediate electrode, and
   the first memory element includes a first memory cell.

7. The method as claimed in claim 6, wherein:
   the first switching electrode includes an ovonic threshold switch material, and
   the first memory cell includes a variable resistance material.

8. The method as claimed in claim 6, wherein the first lower electrode, the first intermediate electrode, and the first upper electrode include a non-metallic conductor.

9. The method as claimed in claim 8, wherein the non-metallic conductor includes an N-doped carbon.

10. The memory device as claimed in claim 6, wherein the first memory element includes a first lower interface between the first cell stack and the first memory cell, and a first upper interface between the first memory cell and the first upper electrode, the first lower interface and the first upper interface each including a metal.

11. The method as claimed in claim 5, wherein:
    the curing process includes a UV-cure process, and
    the planarization process includes a chemical mechanical polishing process.

12. The method as claimed in claim 5, further comprising:
    forming X-directional spacers on sidewalls of the first preliminary cell stacks and the first word lines in the first X-directional gaps, and
    forming Y-directional spacers on sidewalls of the first cell stacks and the bit lines in the first Y-directional gaps.

13. The method as claimed in claim 5, further comprising:
    forming a second cell stack material layer on the bit lines and the first Y-directional gap-fill insulator,
    forming second preliminary cell stacks by patterning the second cell stack material layer using a second Y-directional trimming process, second Y-directional gaps being formed between the second preliminary cell stacks,
    forming a second lower Y-directional gap-fill insulator filling the second Y-directional gaps using a second lower Y-directional gap-fill process,
    forming a second upper Y-directional gap-fill insulator on the second lower Y-directional insulator using a second upper Y-directional gap-fill process, and
    forming a second Y-directional gap-fill insulator by curing and planarizing the second lower Y-directional gap-fill insulator and the second upper Y-directional gap-fill insulator,
    wherein:
    the second lower Y-directional gap-fill process is performed using a fifth source gas that includes the first precursor and the second precursor, and the second upper Y-directional gap-fill process is performed using a sixth source gas that includes the first precursor and the second precursor,
a fifth volume ratio of the first precursor to the second precursor in the fifth source gas is greater than 15:1, and
a sixth volume ratio of the first precursor to the second precursor in the sixth source gas is less than 15:1.

14. The method as claimed in claim 13, further comprising:
forming a second word line material layer on the second preliminary cell stacks and the second Y-directional gap-fill insulator,
forming second word lines and second cell stacks by patterning the second word line material layer and the second preliminary cell stacks using a second X-directional trimming process, wherein second X-directional gaps are formed between the second cell stacks,
forming a second lower X-directional gap-fill insulator filling the second X-directional gaps using a second lower X-directional gap-fill process,
forming a second upper X-directional gap-fill insulator on the second lower X-directional gap-fill insulator using a second upper X-directional gap-fill process, and
forming a second X-directional gap-fill insulator by curing and planarizing the second lower X-directional gap-fill insulator and the second upper X-directional gap-fill insulator,
wherein:
the second lower X-directional gap-fill process is performed using a seventh source gas that includes the first precursor and the second precursor, and
the second upper X-directional gap-fill process is performed using an eighth source gas that includes the first precursor and the second precursor,
a seventh volume ratio of the first precursor to the second precursor in the seventh source gas is greater than 15:1, and
an eighth volume ratio of the first precursor to the second precursor in the eighth source gas is less than 15:1.

15. The method as claimed in claim 14, further comprising:
forming Y-directional spacers on sidewalls of the second preliminary cell stacks in the second Y-directional gaps, and
forming X-directional spacers on sidewalls of the second cell stacks and the second word lines in the second X-directional gaps.

16. A method of fabricating a cross-point type semiconductor memory device, the method comprising:
forming word lines and cell stacks on an underlayer, gaps being formed between the cell stacks,
performing a lower gap-fill process to form a lower gap-fill insulator in the gaps,
performing an upper gap-fill process to form an upper gap-fill insulator on the lower gap-fill insulator,
curing the lower gap-fill insulator and the upper gap-fill insulator to form a gap-fill insulator, and
forming bit lines on the cell stacks and the gap-fill insulator,
wherein:
the lower gap-fill process is performed using a first source gas that includes a first precursor and a second precursor, and
the upper gap-fill process is performed using a second source gas that includes the first precursor and the second precursor,
the first precursor includes octamethylcyclotetrasilioxane,
the second precursor includes at least one of tetramethoxysilane or tetramethylorthosilicate,
a first volume ratio of the first precursor to the second precursor in the first source gas is greater than 15:1, and
a second volume ratio of the first precursor to the second precursor in the second source gas is less than 15:1.

17. The method as claimed in claim 16,
wherein the lower gap-fill process includes a lower first directional gap-fill process and a lower second directional gap-fill process, and the upper gap-fill process includes an upper first directional gap-fill process and an upper second directional gap-fill process, and
wherein the forming of the cell stacks includes:
forming a cell stack material layer,
forming preliminary cell stacks by patterning the cell stack material layer using a first directional trimming process, first directional gaps being formed between the preliminary cell stacks,
performing a lower first directional gap-fill process to form a lower first directional gap-fill insulator filling the first directional gaps,
performing an upper first directional gap-fill process to form an upper first directional gap-fill insulator on the lower first directional gap-fill insulator,
curing the lower first directional gap-fill insulator and the upper first directional gap-fill insulator to form a first directional gap-fill insulator,
patterning the preliminary cell stacks using a second directional trimming process to form the cell stacks, second directional gaps being formed between the cell stacks,
performing a lower second directional gap-fill process to form a lower second directional gap-fill insulator filling the second directional gaps,
performing an upper second directional gap-fill process to form an upper second directional gap-fill insulator on the lower second directional gap-fill insulator, and
forming a second directional gap-fill insulator by curing the lower second directional gap-fill insulator and the upper second directional gap-fill insulator.

18. The method as claimed in claim 17, wherein:
the first volume ratio of the first precursor to the second precursor in the first source gas is 20:1 to 50:1, and
the second ratio of the first precursor and the second precursor in the second source gas is 1:1 to 10:1.

19. A method of fabricating a cross-point type semiconductor memory device, the method comprising:
forming a word line material layer and a cell stack material layer on an underlayer,
performing an X-directional trimming process to form preliminary cell stacks and word lines, wherein the preliminary cell stacks and word lines extend in an X-direction, and X-directional gaps extending in the X-direction are formed between the preliminary cell stacks,
forming X-directional spacers on opposite sidewalls of the word lines and the preliminary cell stacks in the X-directional gaps,
performing a lower X-directional gap-fill process to form a lower X-directional gap-fill insulator that fills the X-directional gaps between the X-directional spacers,
performing an upper X-directional gap-fill process to form an upper X-directional gap-fill insulator on the lower X-directional gap-fill insulator, curing and planarizing the lower X-directional gap-fill insulator and the upper X-directional gap-fill insulator to form an X-directional gap-fill insulator, performing a Y-directional trimming process to form cell stacks, wherein the cell stacks have a columnar shape, and Y-directional gaps extending in a Y-direction are formed between the cell stacks, forming Y-directional spacers on opposite sidewalls of the cell stacks and the X-directional gap-fill insulator in the Y-directional gaps, performing a lower Y-directional gap-fill process to form a lower Y-directional gap-fill insulator that fills the Y-directional gaps between the Y-directional spacers, performing an upper Y-directional gap-fill process to form an upper Y-directional gap-fill insulator on the lower Y-directional gap-fill insulator, and curing and planarizing the lower Y-directional gap-fill insulator and the upper Y-directional gap-fill insulator to form a Y-directional gap-fill insulator, wherein:

the lower X-directional gap-fill process and the lower Y-directional gap-fill process are performed using a first source gas that includes a first precursor and a second precursor, and the upper X-directional gap-fill process and the upper Y-directional gap-fill process are performed using a second source gas that includes the first precursor and the second precursor, a first volume ratio of the first precursor to the second precursor in the first source gas is greater than 15:1, and a second volume ratio of the first precursor to the second precursor in the second source gas is less than 15:1.

20. The device as claimed in claim 19, wherein:

each of the cell stacks includes a switching element, a memory element, and an upper electrode, the switching element includes a lower electrode, a switching electrode, and an intermediate electrode, the memory element includes a lower interface, a memory cell, and an upper interface, the switching electrode includes an ovonic threshold switch material, the memory cell includes a variable resistance material, the lower electrode, the intermediate electrode, and the upper electrode each include N-doped carbon, and the lower interface and the upper interface each include a metal.

* * * * *